(12) United States Patent
Jian

(10) Patent No.: US 9,413,329 B2
(45) Date of Patent: *Aug. 9, 2016

(54) FLIP CHIP TYPE SAW BAND REJECT FILTER DESIGN

(71) Applicant: Telefonaktiebolaget L M Ericsson (publ), Stockholm (SE)

(72) Inventor: Chunyun Jian, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/933,490

(22) Filed: Nov. 5, 2015

(65) Prior Publication Data

US 2016/0056792 A1    Feb. 25, 2016

Related U.S. Application Data

(63) Continuation of application No. 13/760,651, filed on Feb. 6, 2013, now Pat. No. 9,281,799.

(51) Int. Cl.

| | |
|---|---|
| *H03H 9/00* | (2006.01) |
| *H03H 9/02* | (2006.01) |
| *H03H 3/02* | (2006.01) |
| *H03H 9/25* | (2006.01) |
| *H03H 9/64* | (2006.01) |

(52) U.S. Cl.
CPC .............. *H03H 9/02992* (2013.01); *H03H 3/02* (2013.01); *H03H 9/25* (2013.01); *H03H 9/64* (2013.01); *H03H 9/6409* (2013.01)

(58) Field of Classification Search
CPC . H03H 9/6483; H03H 9/6436; H03H 9/6433; H03H 9/1071; H03H 9/0038

USPC .......................................... 333/186, 193–196
See application file for complete search history.

(56) References Cited

U.S. PATENT DOCUMENTS

| | | |
|---|---|---|
| 6,710,677 B2 | 3/2004 | Beaudin et al. |
| 6,924,715 B2 | 8/2005 | Beaudin et al. |
| 7,777,597 B2 | 8/2010 | Beaudin et al. |

(Continued)

FOREIGN PATENT DOCUMENTS

WO    2014083488 A2    6/2014

OTHER PUBLICATIONS

Chun-Yun et al., "SAW Band Reject Filter Performance at 850 MHz," Published in: 2005 IEEE Ultrasonics Symposium, pp. 2162-2165, Print ISBN: 0-7803-9383-X/05, Date of Conference: Sep. 18-21, 2005 consisting of 4-pages.

(Continued)

*Primary Examiner* — Lincoln Donovan
*Assistant Examiner* — Diana J Cheng
(74) *Attorney, Agent, or Firm* — Christopher & Weisberg, P.A.

(57) ABSTRACT

A method and system for providing a surface acoustic wave band reject filter are disclosed. According to one aspect, a surface acoustic wave band reject filter includes a substrate having electrode bars and bonding pads formed on the substrate. The filter further includes at least one die having a side facing the substrate. A plurality of surface acoustic wave resonators are formed on the at least one die formed on the substrate. Solder balls formed on a side of the at least one die facing the substrate are positioned to engage bonding pads on the substrate. The plurality of surface acoustic wave resonators collectively exhibit a band reject filter response.

20 Claims, 27 Drawing Sheets

(56) References Cited

U.S. PATENT DOCUMENTS

| | | | |
|---|---|---|---|
| 8,018,304 | B2 | 9/2011 | Jian |
| 8,060,156 | B2 | 11/2011 | Gagnon et al. |
| 8,204,031 | B2 | 6/2012 | Jian et al. |
| 2001/0029650 | A1 | 10/2001 | Takata et al. |
| 2005/0099244 | A1 | 5/2005 | Nakamura et al. |
| 2008/0224799 | A1 | 9/2008 | Taniguchi |
| 2011/0090026 | A1 | 4/2011 | Nakahashi et al. |
| 2011/0235557 | A1 | 9/2011 | Jian |

OTHER PUBLICATIONS

Bauer et al., "SAW Band Rejection Filters for Mobile Digital Television," Published in: 2008 IEEE International Ultrasonics Symposium Proceedings, pp. 288-291, Print ISBN: 978-1-4244-2480, Digital Object Identifier (DOI): 10.1109/ULTSYM.2008.0071, Date of Conference: Nov. 2-5, 2008 consisting of 4-pages.

International Search Report and Written Opinion dated Jul. 2, 2014 for International Application No. PCT/IB2014/058342, International Filing Date: Jan. 16, 2014 consisting of 12-pages.

Written Opinion of the International Preliminary Examining Authority dated Jan. 30, 2015 for International Application No. PCT/IB2014/058342, International Filing Date: Jan. 16, 2014 consisting of 12-pages.

International Preliminary Report on Patentability, Form/PCT/IPEA/409, dated May 7, 2015 for corresponding International Application No. PCT/IB2014/058342; International Filing Date: Jan. 16, 2014, consisting of 14-pages.

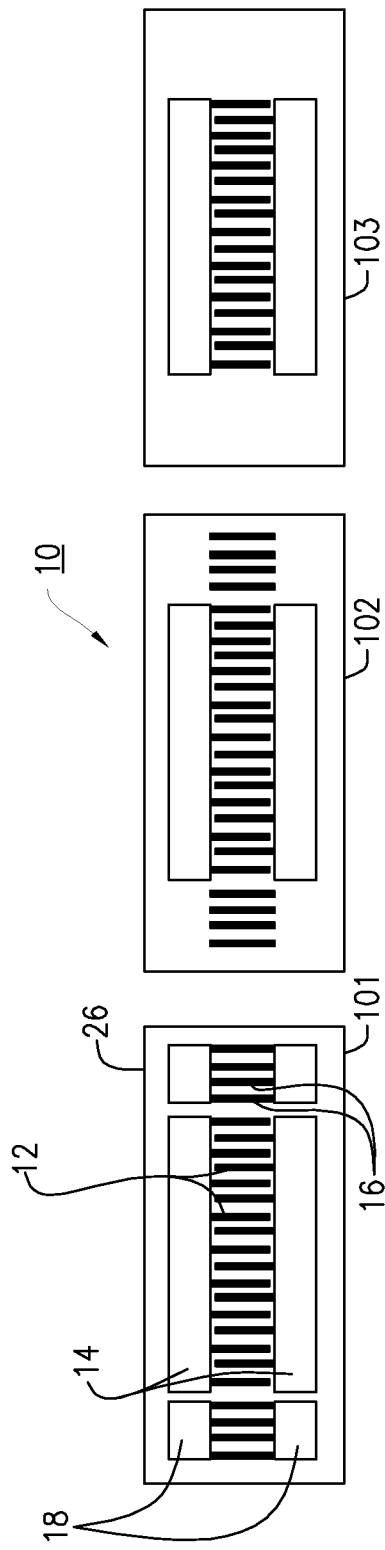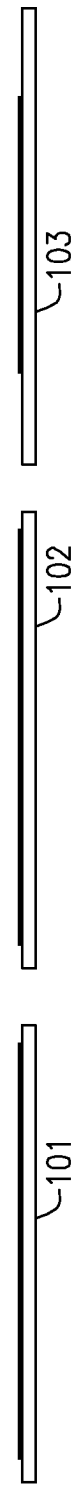
FIG. 1
(Prior Art)
FIG. 2
(Prior Art)

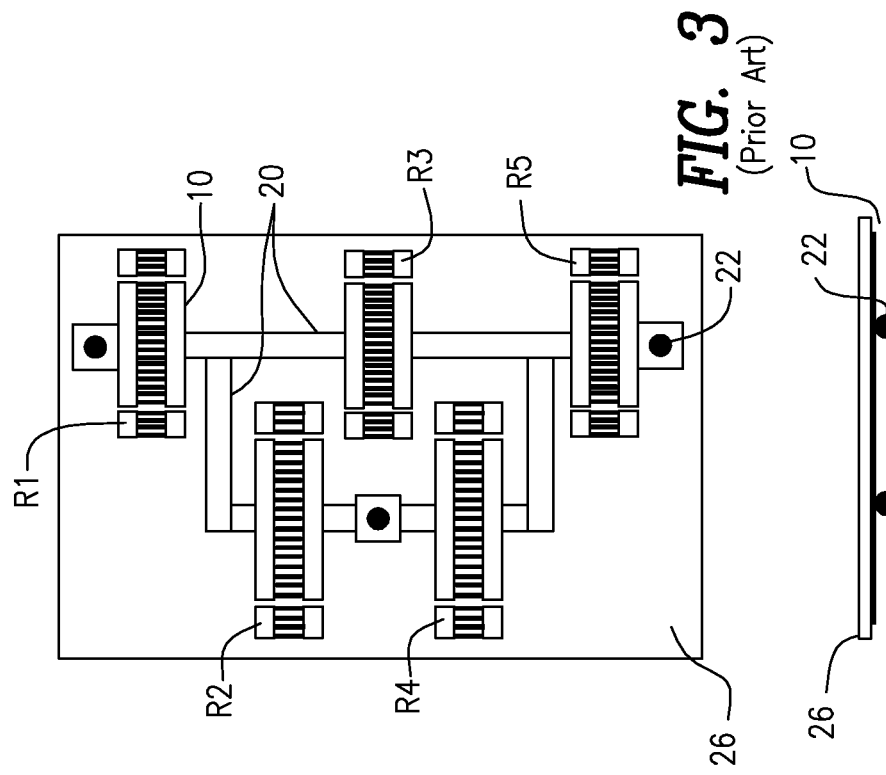
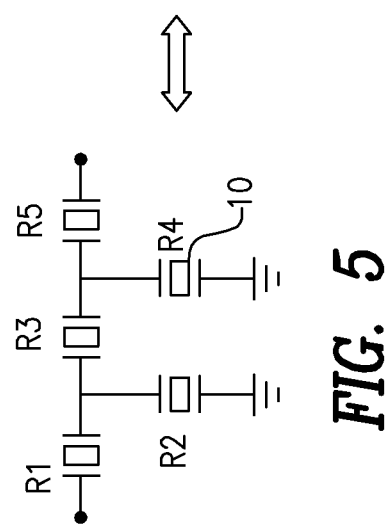
FIG. 3 (Prior Art)
FIG. 4 (Prior Art)
FIG. 5

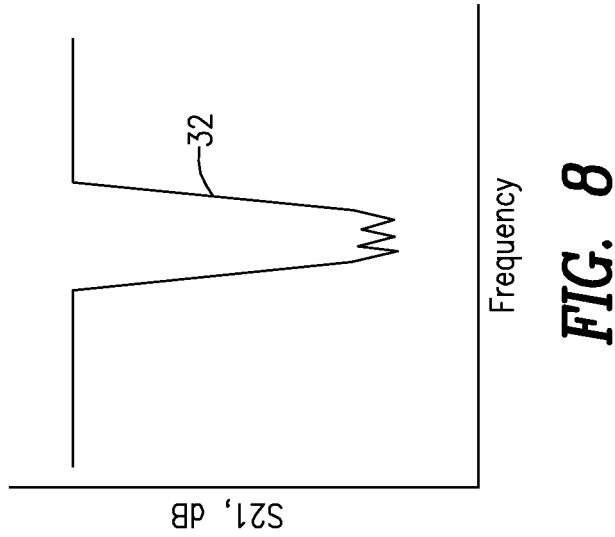
FIG. 8
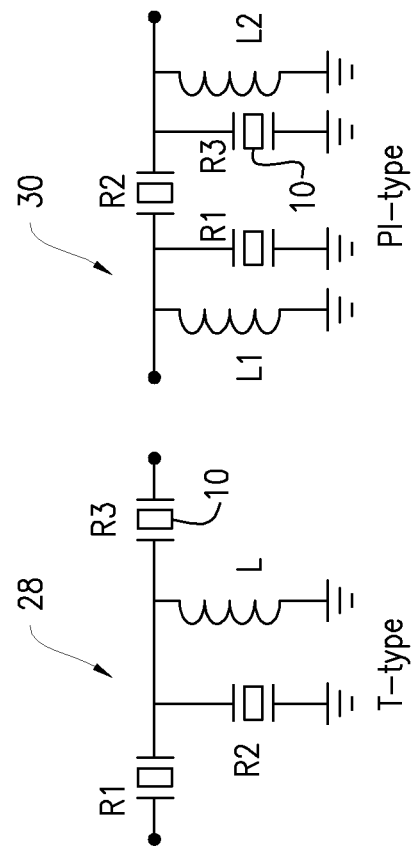
FIG. 7
FIG. 6

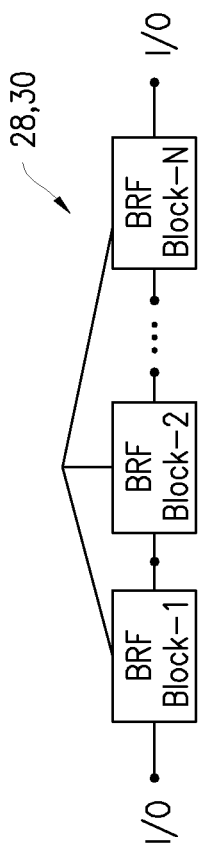
FIG. 9
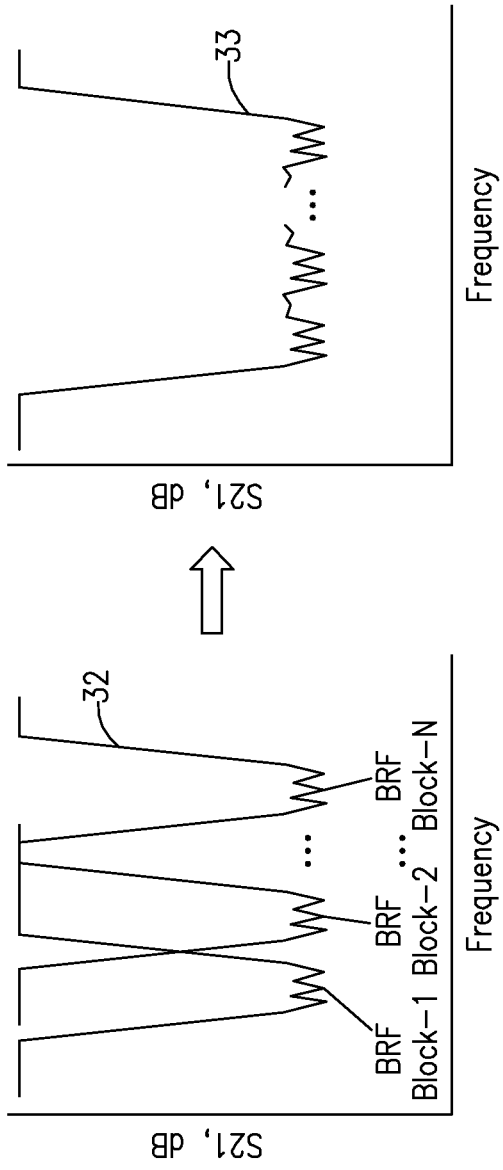
FIG. 10
FIG. 11

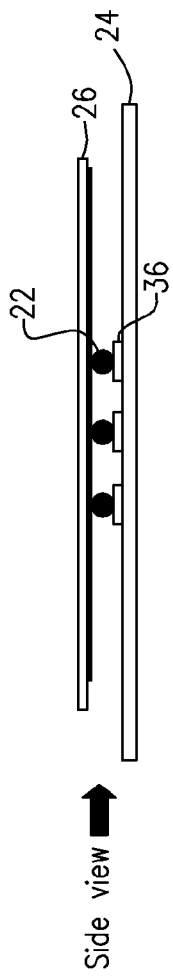
FIG. 18 Side view
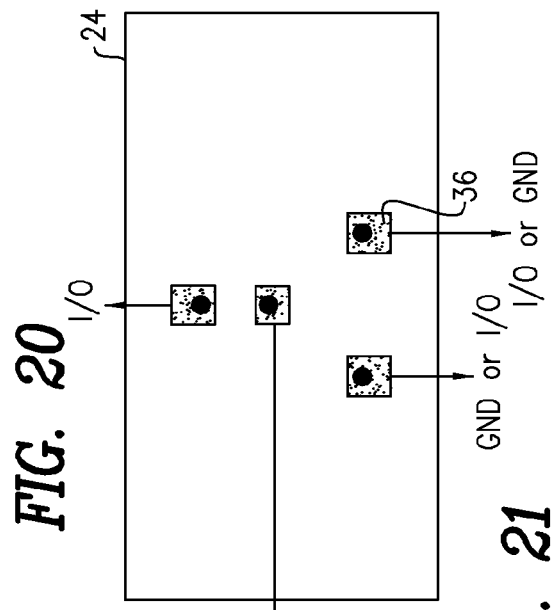
FIG. 20
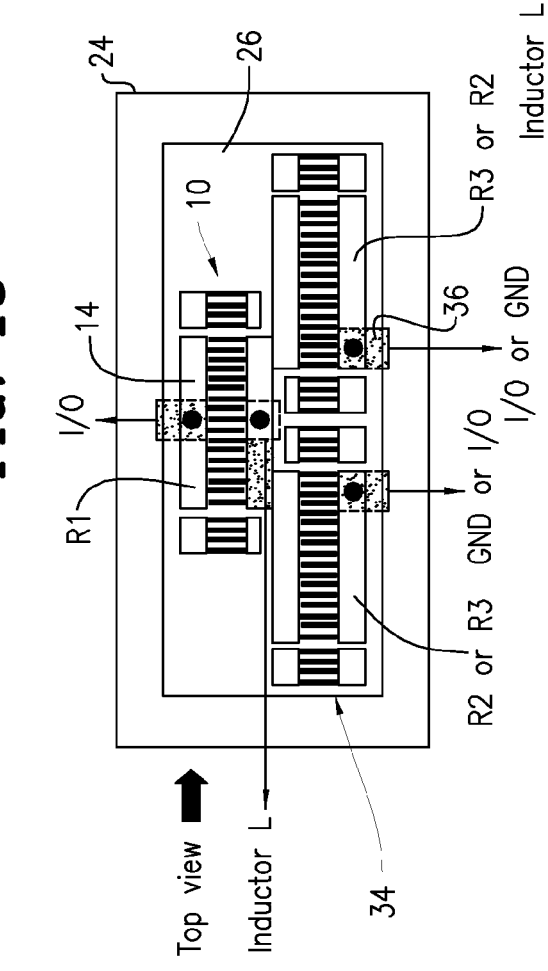
FIG. 19 Top view
FIG. 21

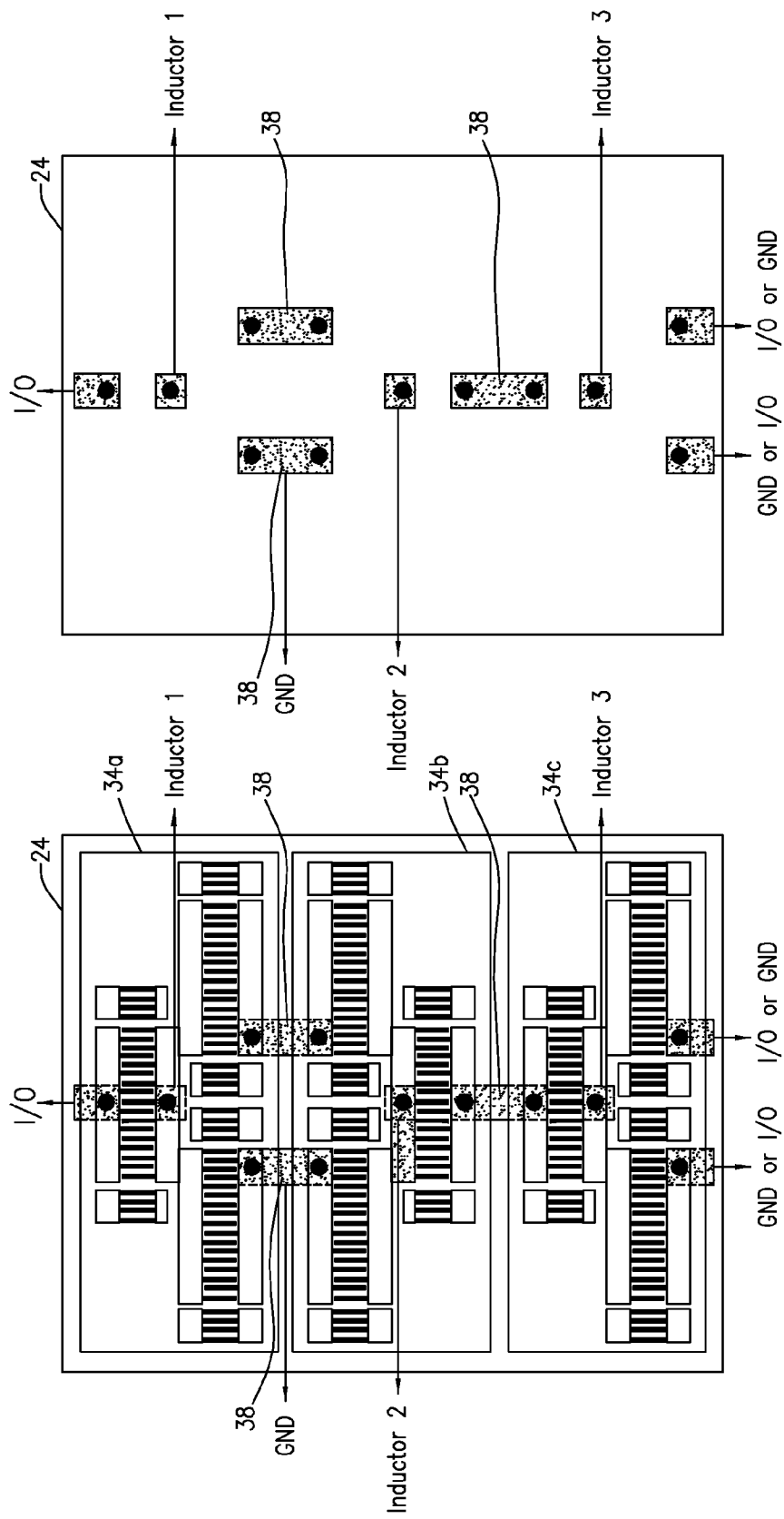

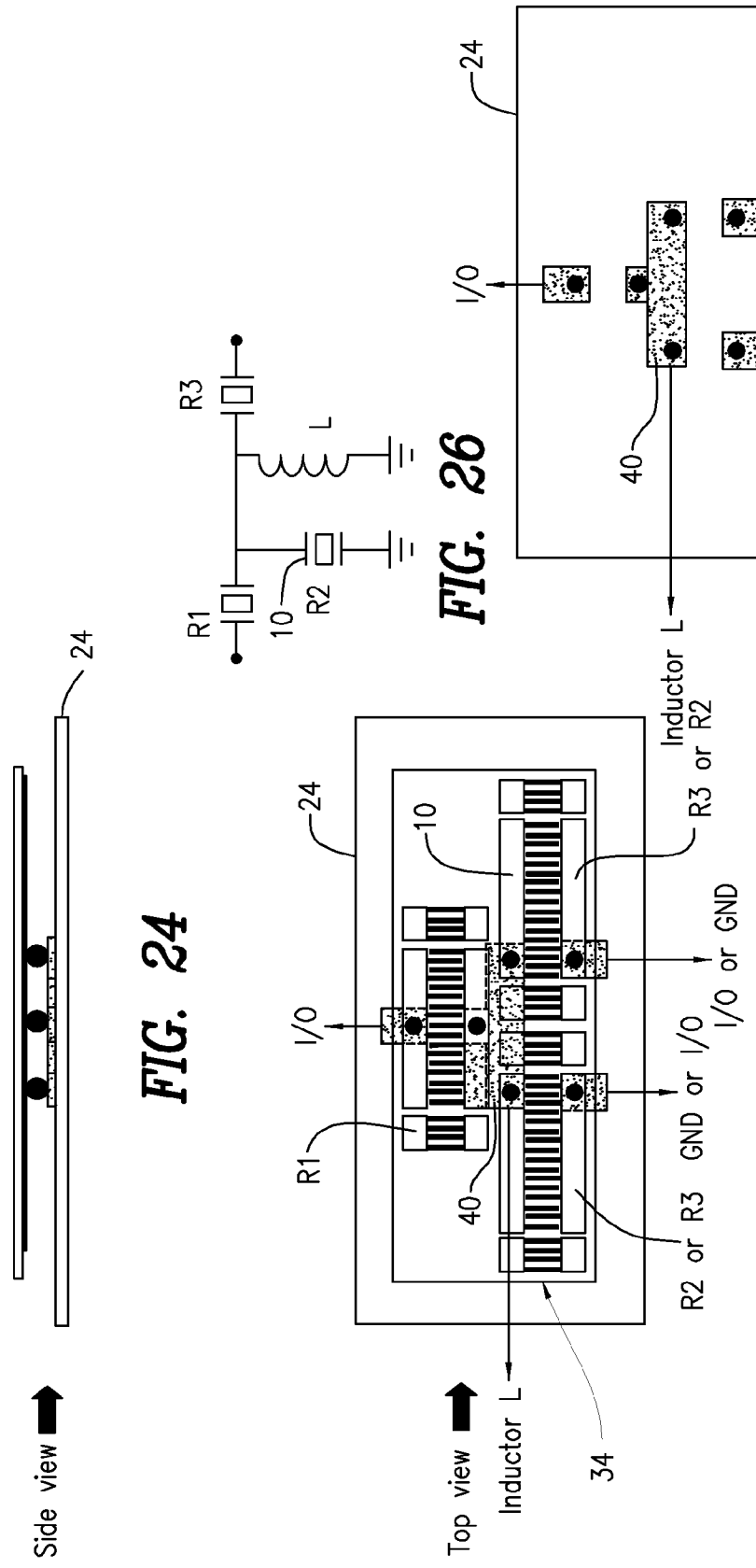

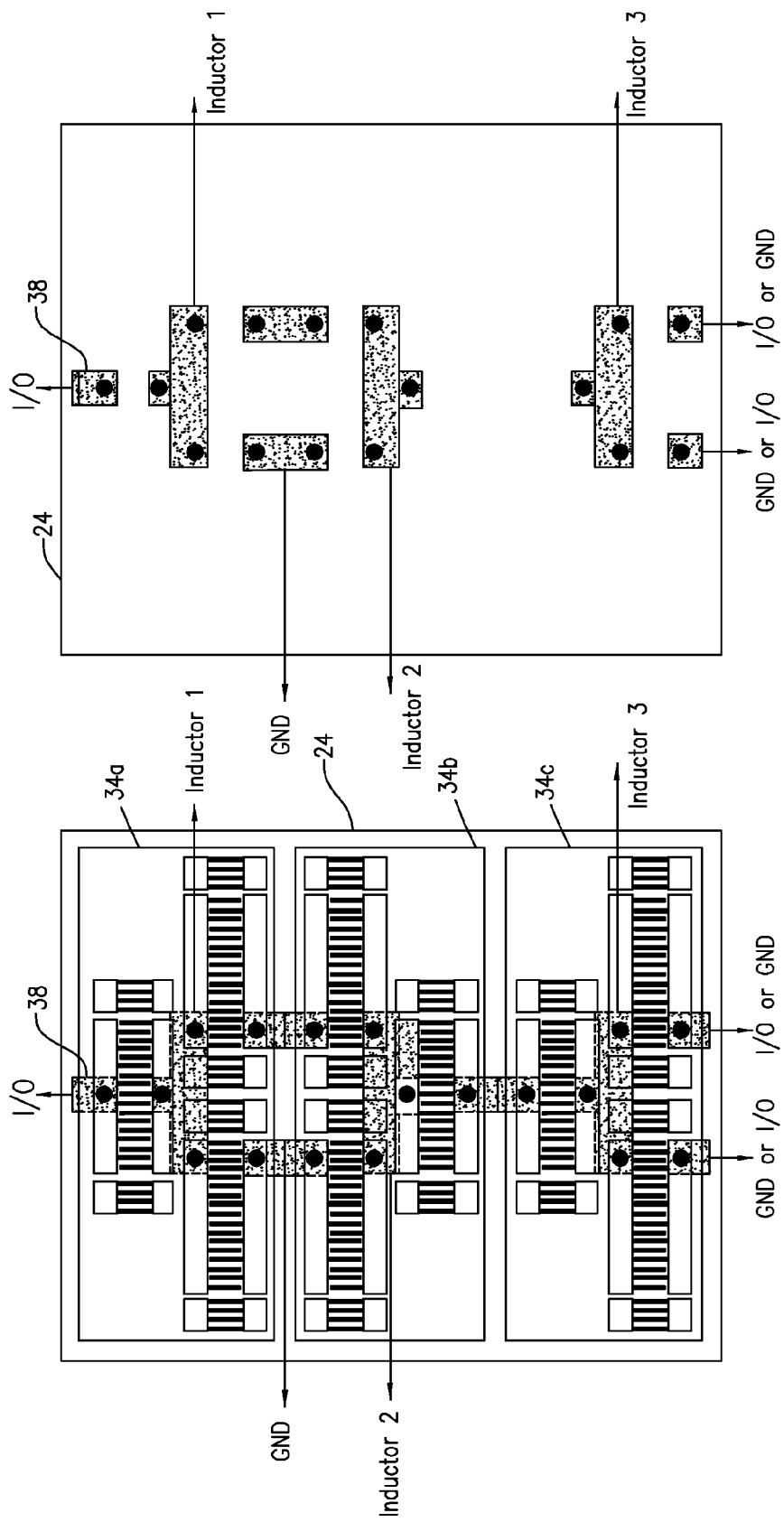

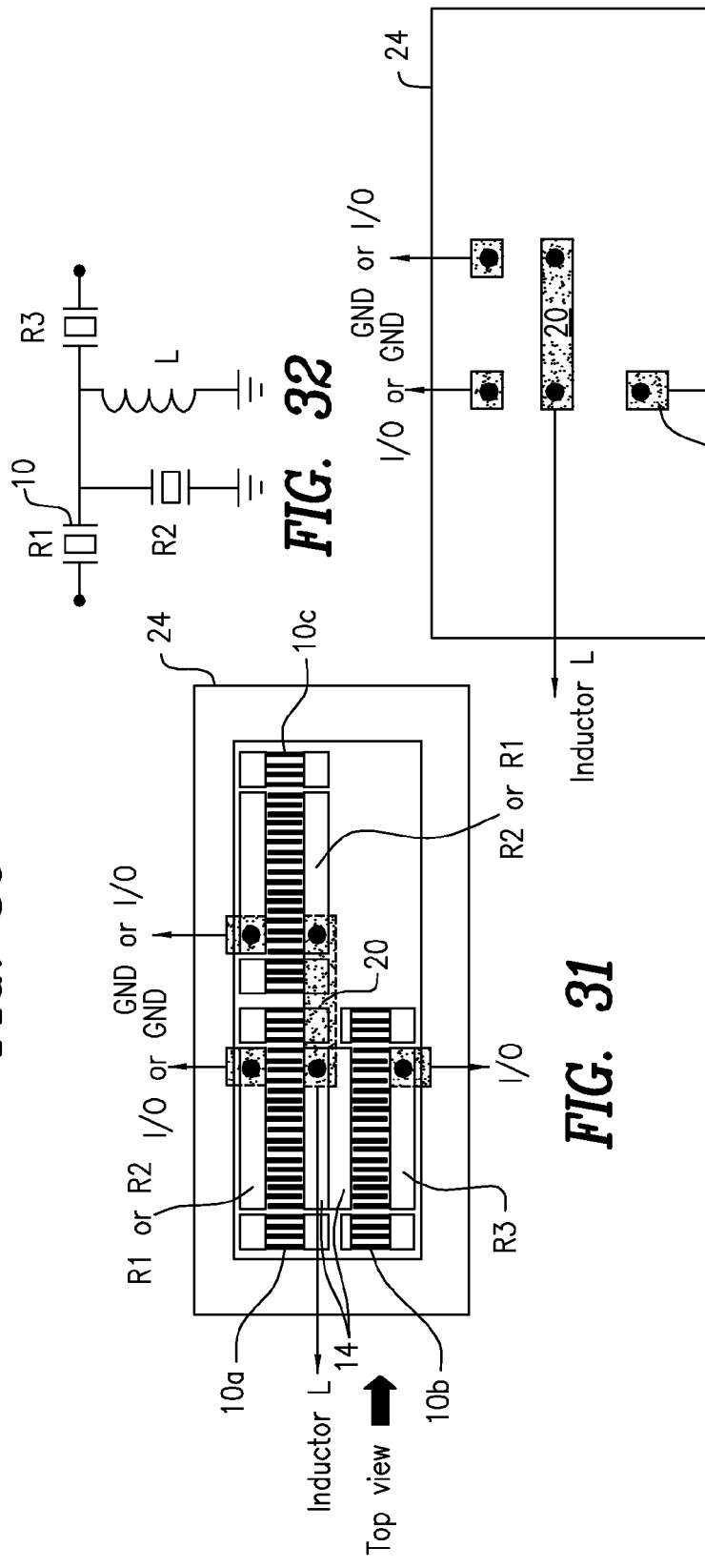

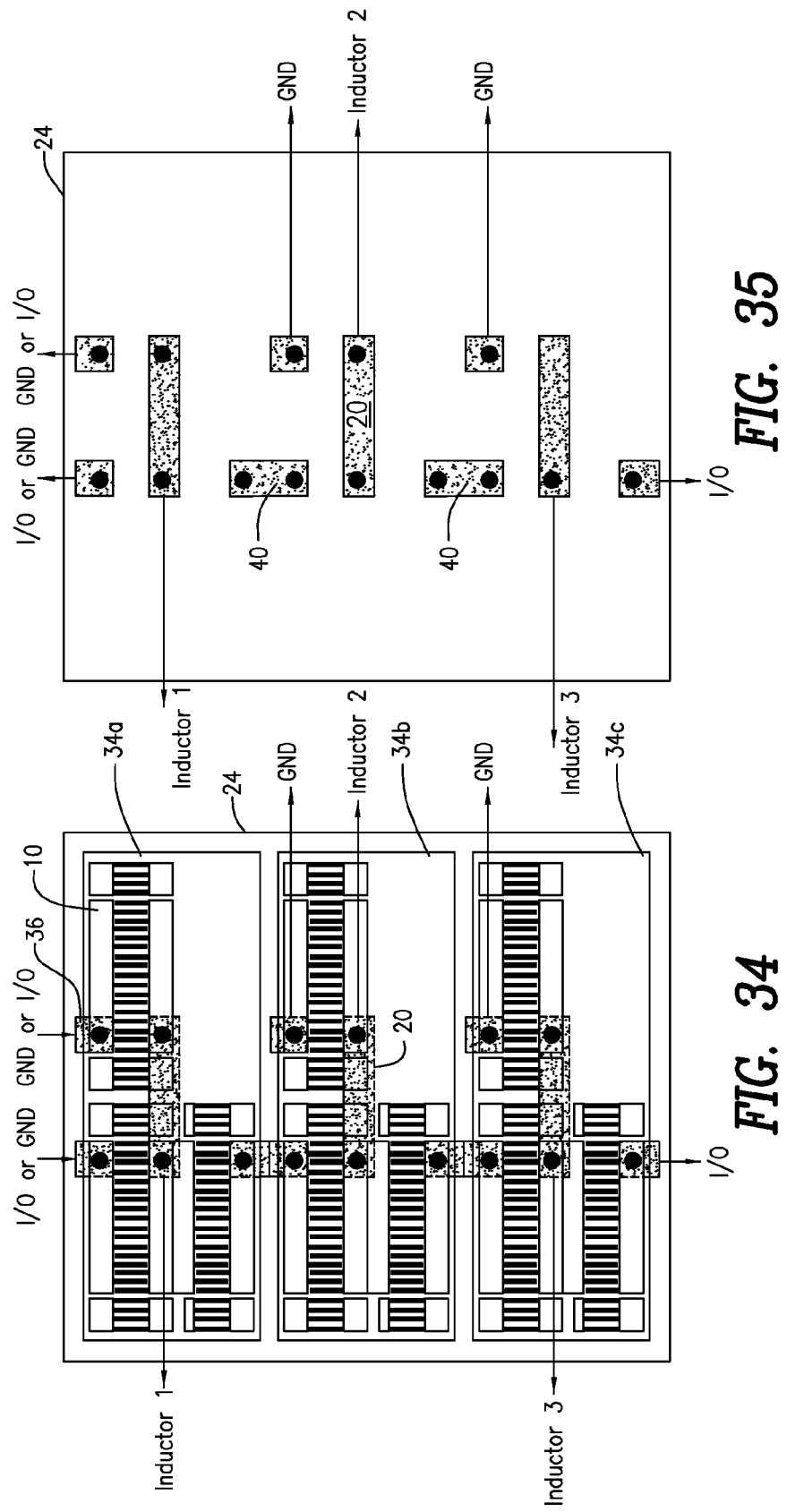

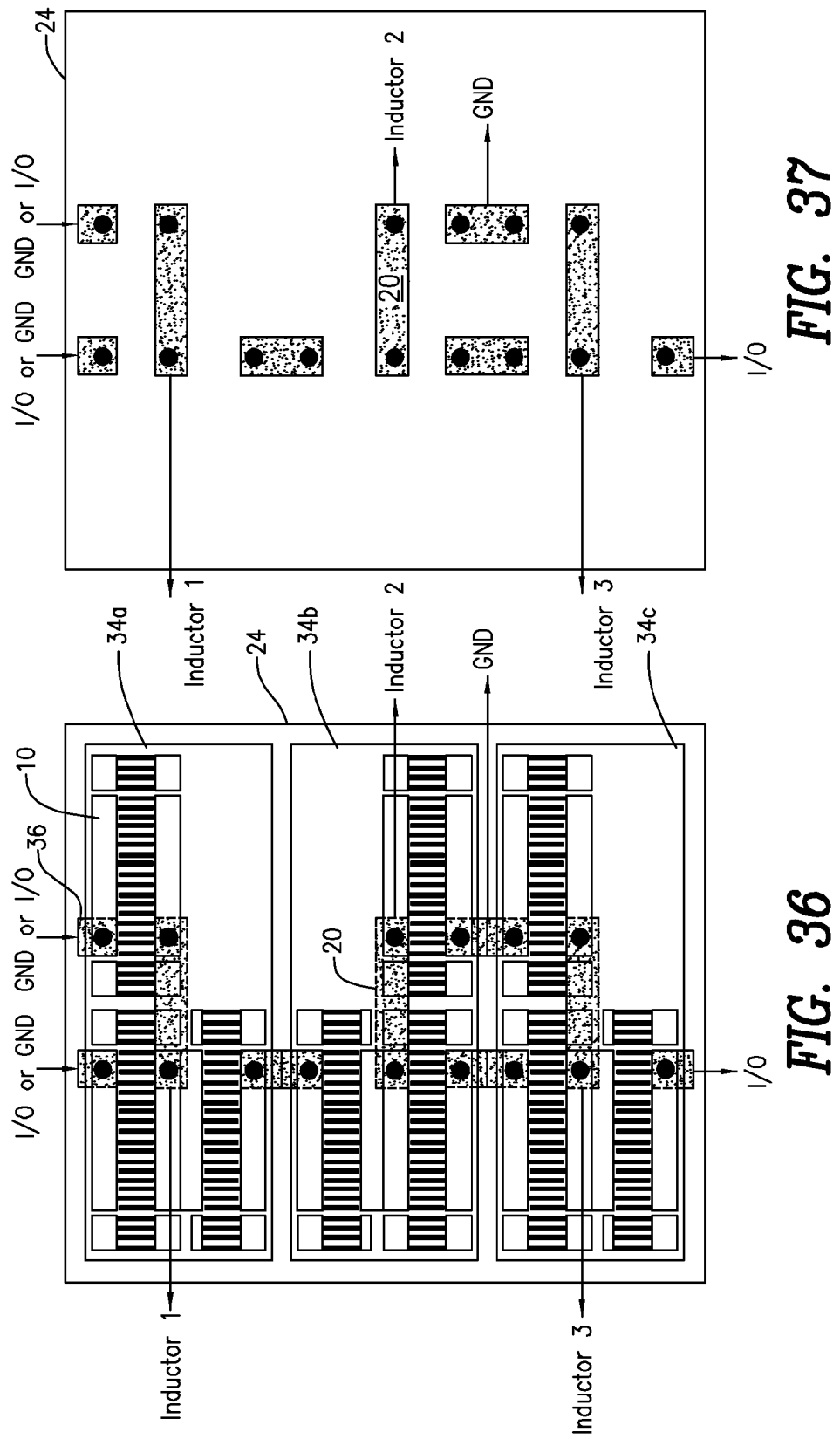

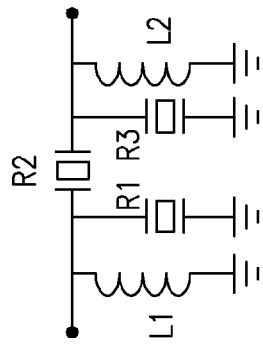
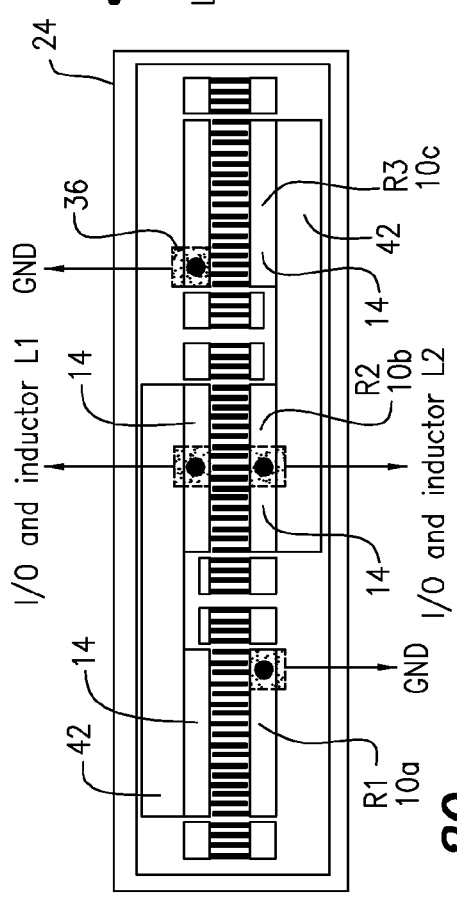
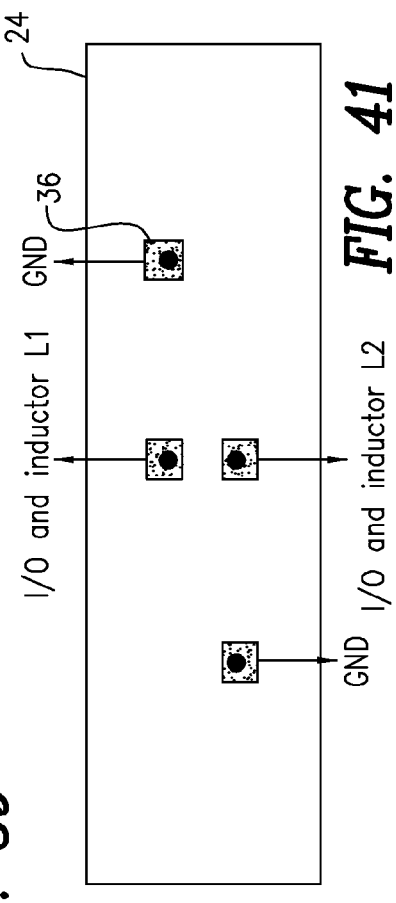

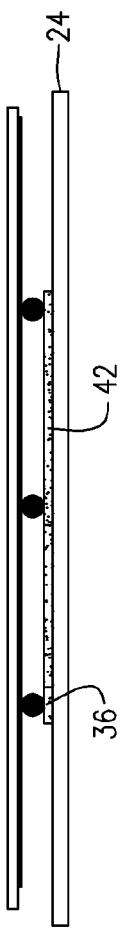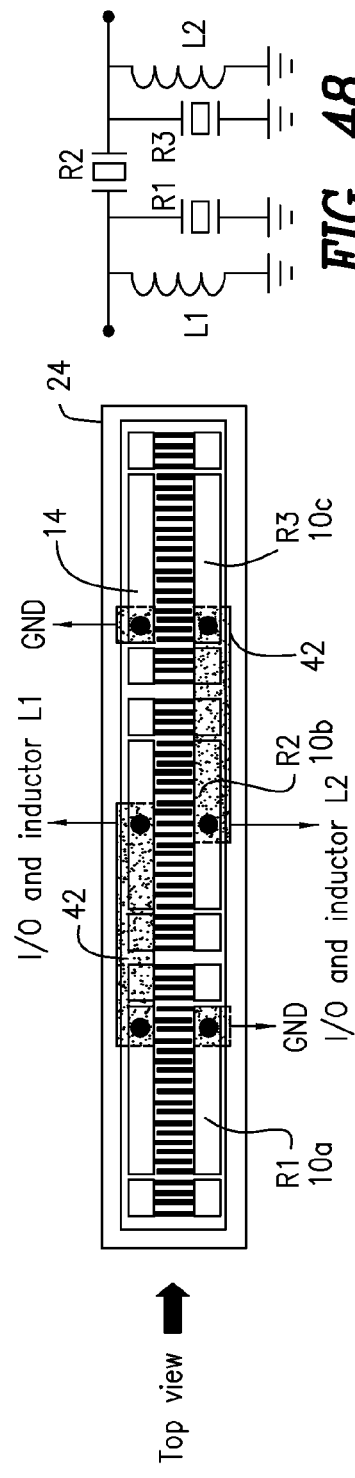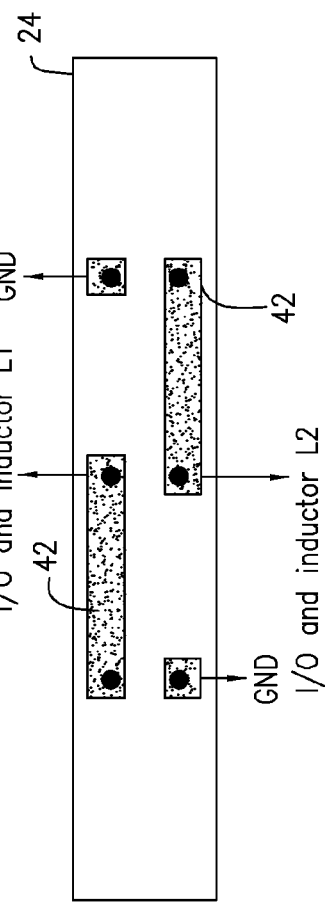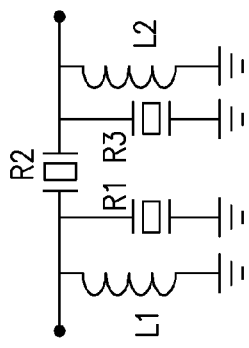
FIG. 46
FIG. 47
FIG. 48
FIG. 49

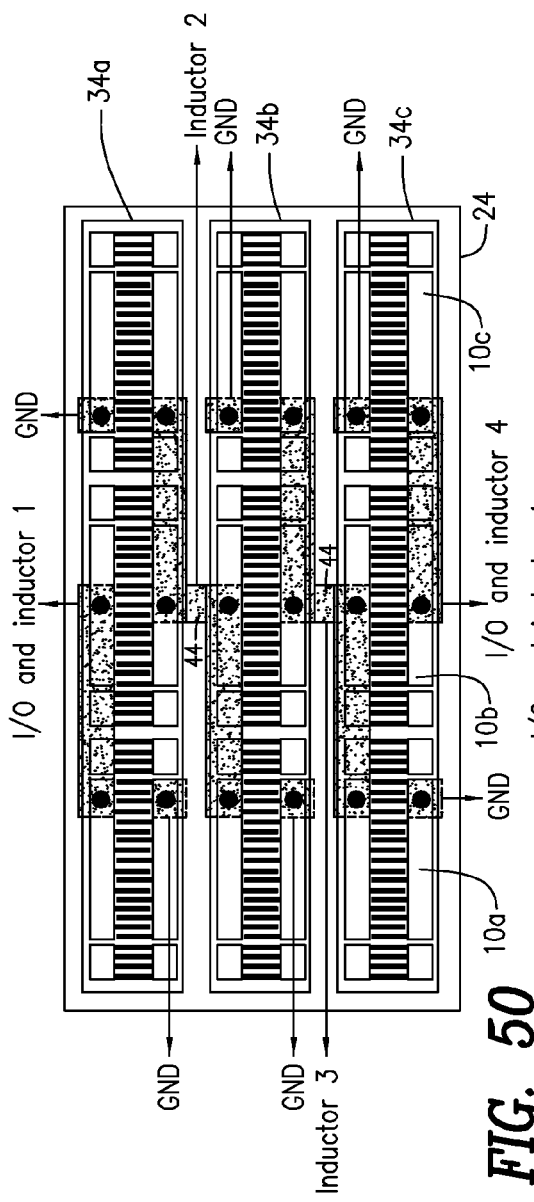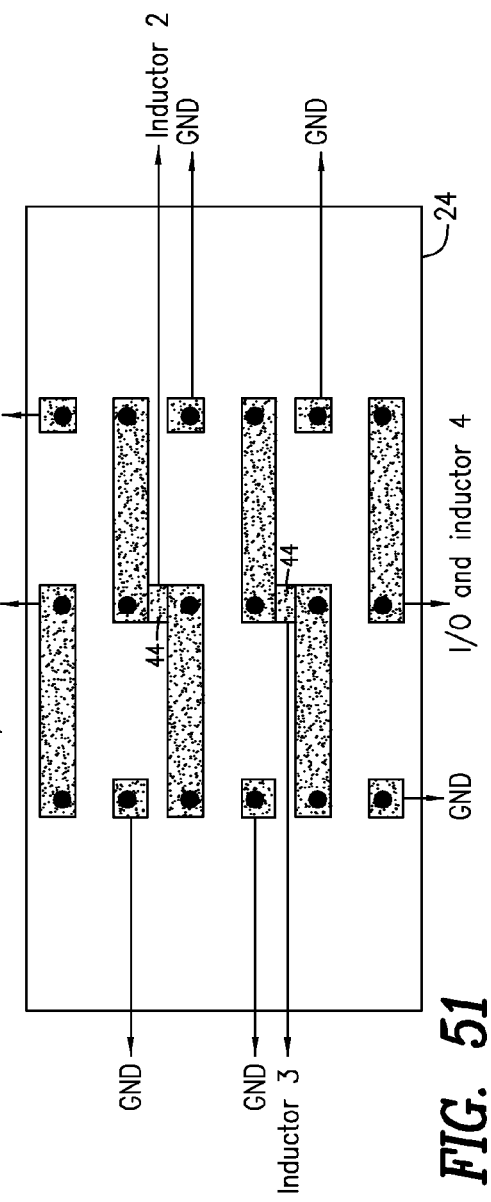
FIG. 50
FIG. 51

FIG. 54 Side view

FIG. 55 Top view

Side view

Top view

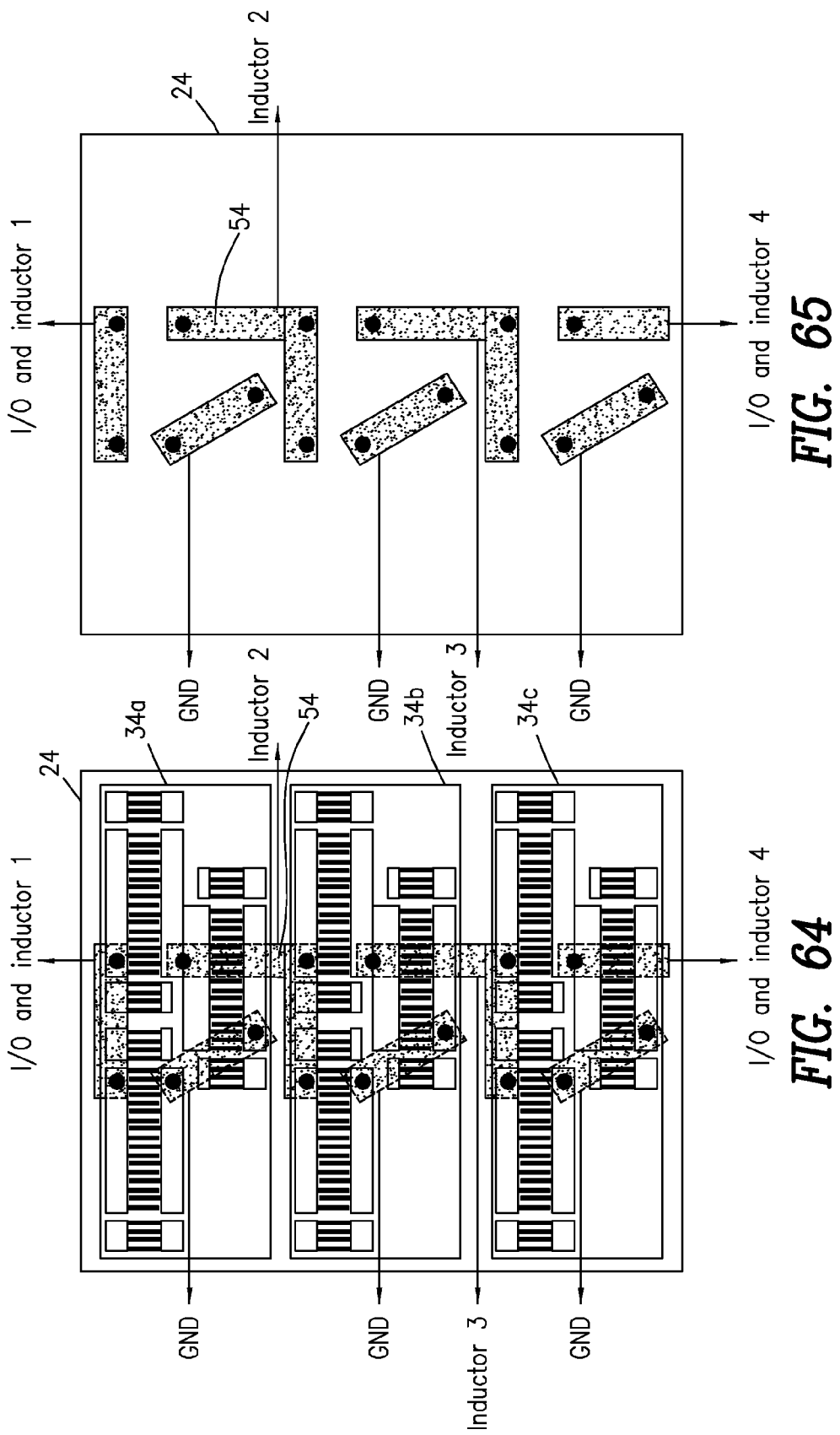

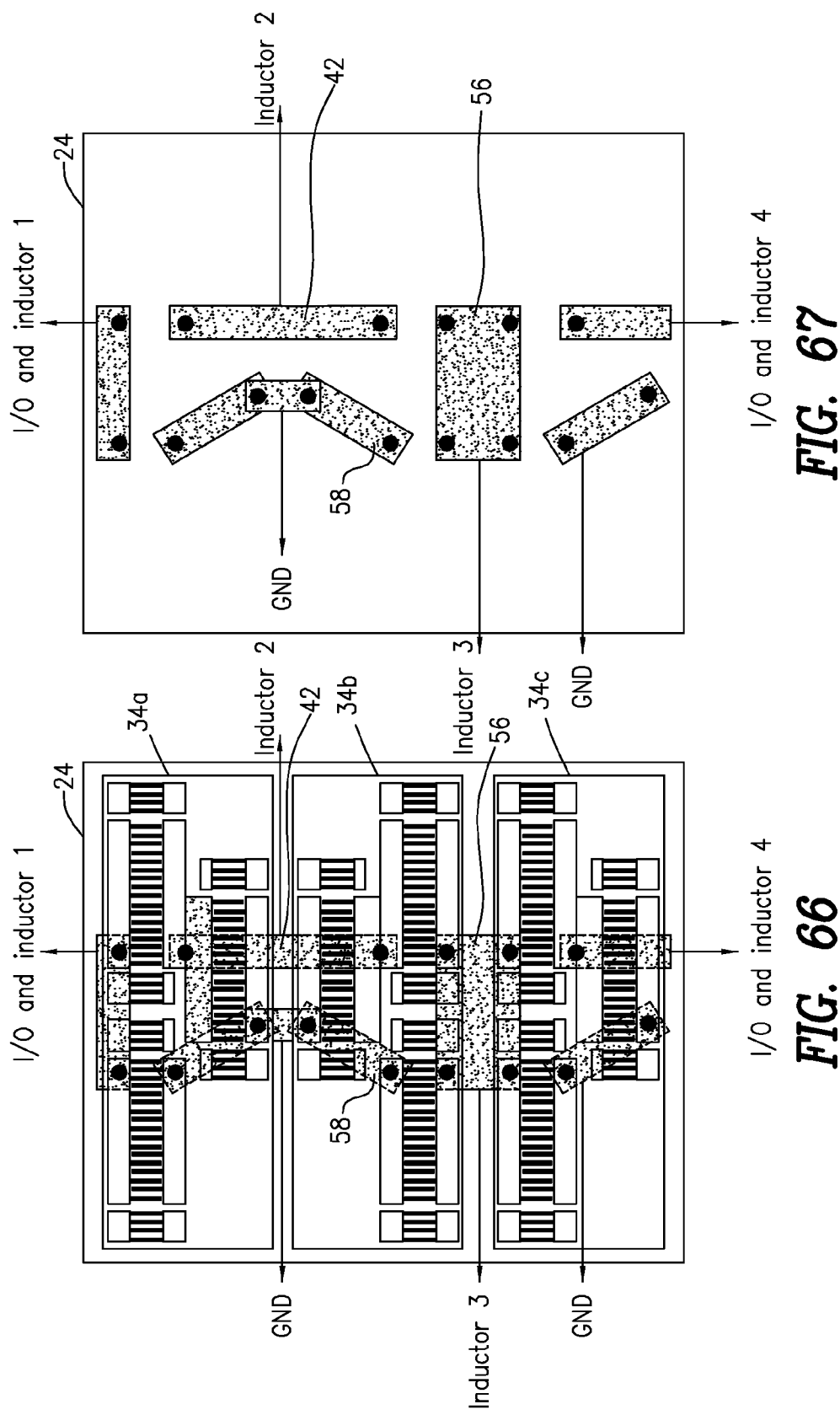

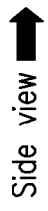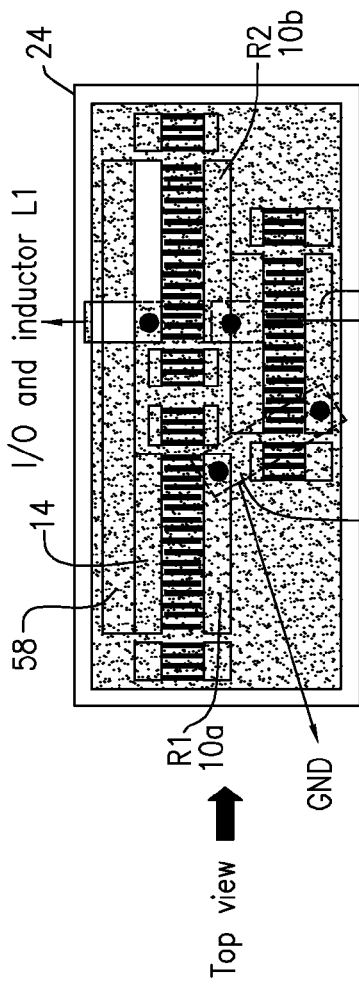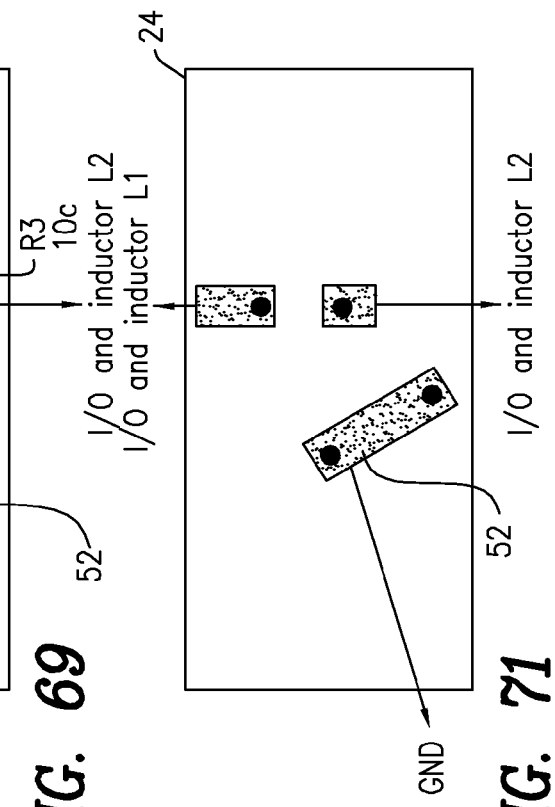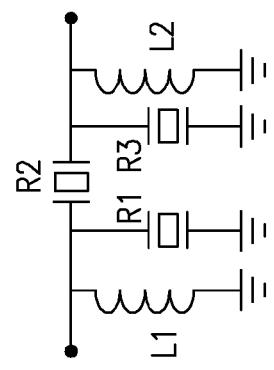

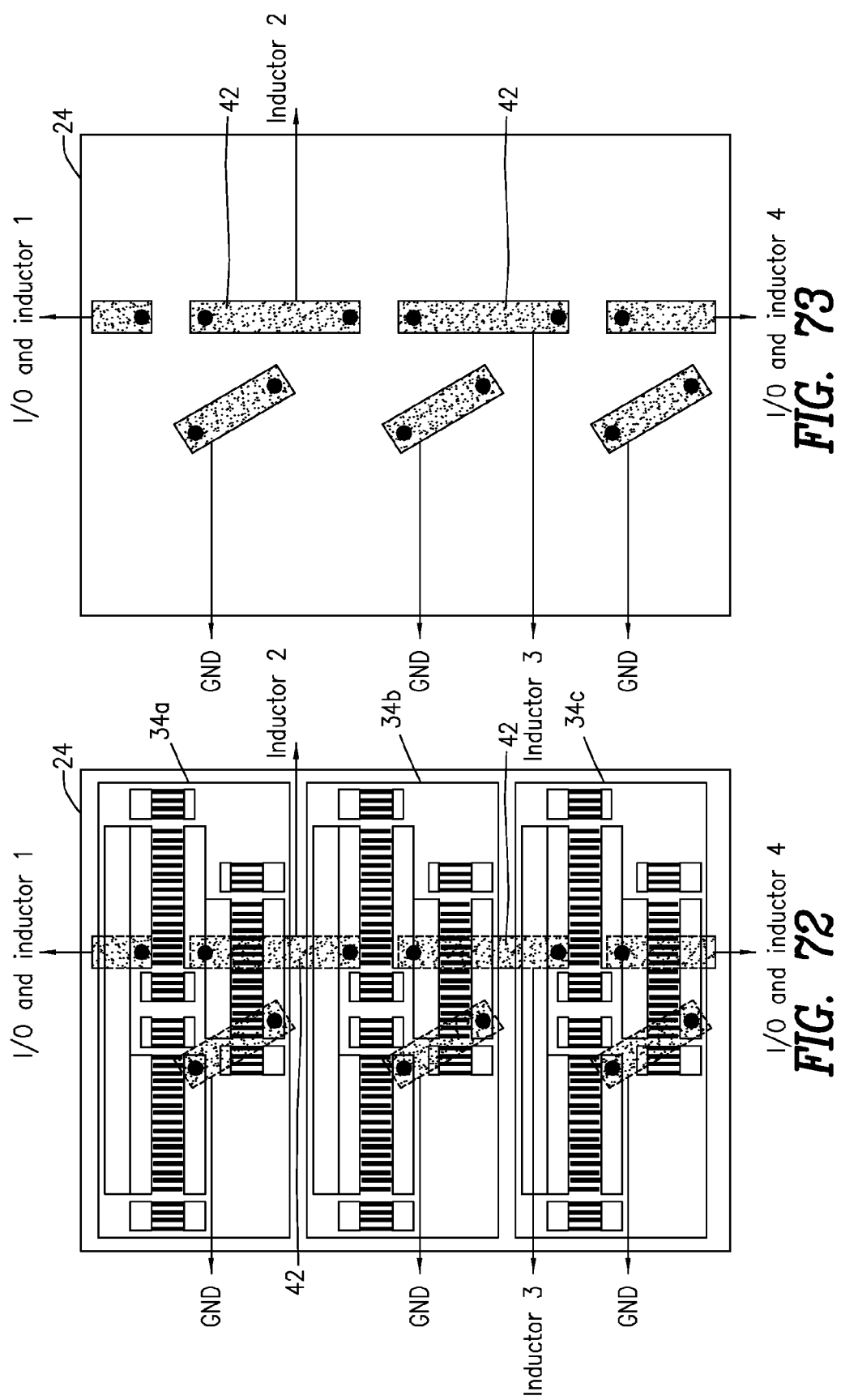

FLIP CHIP TYPE SAW BAND REJECT FILTER DESIGN

TECHNICAL FIELD

The present invention relates to filters, and in particular to surface acoustic wave, SAW, band reject filters.

BACKGROUND

Band reject filters may be used in wireless network equipment, such as in base stations. Desirably, these band reject filters should be miniature in size to reduce the overall size of equipment in which they are installed. Surface acoustic wave, SAW, devices have been used to implement miniature band pass filters, but have not been widely used in band reject filter implementations, primarily due to a lack of demand for such implementations in wireless network equipment that are based on first generation, 1G, and second generation, 2G, wireless communication standards.

However, with the emergence of implementations of third generation, 3G, and fourth generation, 4G, wireless communication standards, frequency spectrum allocation is constrained, requiring very closely spaced frequency channels. This means that filters in a radio frequency, RF, front end must have steep transition bands to avoid interference. Preferably, steep transitions can be achieved with band reject filters having high Q. However, when high Q band reject filters are implemented using conventional components such as air cavity filters, such filters are undesirably large in size and are relatively expensive.

SAW resonators can be used to implement band pass filters and band reject filters. FIG. 1 shows a top view, and FIG. 2 shows a side view, of three known SAW resonators 10. As shown, the SAW resonator has inter-digital transducer, IDT, interlaced fingers 12 electrically connected by two IDT bus bars 14. In one embodiment 101, the SAW resonator has shorted reflector fingers 16 at each end that are shorted by reflector bus bars 18. In another embodiment 102, the SAW resonator has un-shorted reflector fingers at each end. In yet another embodiment 103, reflector fingers are altogether absent. The reflector fingers serve to enclose surface acoustic waves that emanate from the IDT fingers 12.

FIG. 3 is a top view of a known flip chip type SAW band pass filter configuration that includes 5 SAW resonators 10 electrically connected by connecting bus bars 20 in a ladder configuration. Solder balls 22 are provided to make electrical connections with bonding pads on a substrate 24 in order to provide input and output connections and connections to ground. The SAW resonators 10 and the connecting bus bars 20 are formed on a die 26 using conventional semiconductor forming processes, where the die may be cut from a crystal wafer, for example. The solder balls 22 may be formed on the die 26 or the substrate 24. In particular, in one example, the solder balls 22 can be formed on the die 26 after the SAW resonators 10 are formed on the die. The solder balls may be a good conducting metal such as tin, aluminum, copper, silver or gold, or a combination of conducting metals.

FIG. 4 is a side view of the band pass filter configuration of FIG. 3, showing that the SAW resonators 10 are formed on the side of the die 26 that faces the substrate 24. For a conventional band pass filter, the layout design of SAW electrodes shown in FIG. 3 is acceptable because the SAW resonators needed for the band pass filter design are very small. For example, for a 2 Gigahertz (GHz) SAW band pass filter design on a known substrate of 42 YX—LiTaO3, the dimensions of the largest SAW resonator are about 150 micrometers in length by about 100 micrometers in width. Therefore, it is possible to layout all of the SAW resonators that are needed for the band pass filter design to fit within an area of about or less than 2×2 millimeters. The dimensions of 2×2 millimeters are generally considered to be the maximum die size for using the flip chip type SAW assembly technique depicted in FIGS. 3 and 4 to manufacture the SAW filter. FIG. 5 is a block diagram of the SAW resonator configuration implemented in FIG. 3.

However, for a SAW band reject filter design, the SAW resonators need to have a high Q. Thus they are much bigger in dimension than the resonators needed for a band pass filter design. For example, for a 2 GHz SAW band reject filter design on a substrate of 42 STW Quartz, the layout dimensions of the largest individual SAW resonator of the filter design will be of dimensions about 1000 micrometers in length by about 300 micrometers in width. Therefore, the layout topology of FIG. 3 for the SAW band reject filter design would require a huge die and would further require long connecting bus bars that introduce undesirable excessive loss and parasitic inductance to the filter design.

SUMMARY

The present invention advantageously provides a method and system for providing a surface acoustic wave band reject filter implemented in a compact low loss design using flip chip assembly technology. According to one aspect, a surface acoustic wave band reject filter is implemented as a flip chip assembly in which the surface acoustic wave band reject filter includes a substrate having electrode bars and bonding pads formed on the substrate. The filter further includes at least one die having a side facing the substrate. A plurality of surface acoustic wave resonators are formed on the at least one die mounted on the substrate. Solder balls are formed to contact with the side of the at least one die facing the substrate and positioned to electrically engage electrode bars and bonding pads on the substrate. The plurality of surface acoustic wave resonators are connected by the electrode bars via the solder balls and collectively exhibit a band reject filter response.

In one embodiment according to this aspect, a first three of the plurality of the surface acoustic wave resonators are arranged so that two of the plurality of surface acoustic wave resonators are electrically in series, and a third surface acoustic wave resonator is electrically in parallel to the two of the plurality of surface acoustic wave resonators. In some embodiments, three surface acoustic wave resonators are formed on a single die. The three surface acoustic resonators are adjacent such that the solder balls are spaced less than about 2 millimeters apart, and the die is mounted to the substrate using a flip chip technology. At least two of the adjacent surface acoustic wave resonators may share a common bus bar on the die. In some embodiments, three surface acoustic wave resonators are formed on a single die and a first two of the three surface acoustic wave resonators are positioned end to end. The third surface acoustic wave resonator is adjacent to and straddles the first two surface acoustic wave resonators, such that the solder balls are spaced less than about 2 millimeters apart, and the die is mounted to the substrate using a flip chip technology. An electrode bar on the substrate may connect bus bars of the first two surface acoustic wave resonators. In another embodiment, a first three of the plurality of surface acoustic wave resonators are arranged such that a first two surface acoustic wave resonators are electrically in parallel, and a third surface acoustic wave resonator is electrically intervening between the first two surface acoustic wave resonators. In some embodiments, three surface acoustic wave resonators are formed on a single die and a first two of the three surface acoustic wave resonators mounted end to end. A third surface acoustic wave resonator is adjacent to one of the first two surface acoustic wave resonators, such that the solder balls are spaced less than about 2 millimeters apart, and the die is mounted to the substrate using a flip chip technology. In some embodiments, three surface acoustic wave resonators are formed on a single die end to end. A first bus bar connects a first surface acoustic wave resonator with a center surface acoustic wave resonator, and a second bus bar connects a second surface acoustic wave resonator with the center surface acoustic wave resonator on the die. The solder balls are spaced less than 2 millimeters apart and the die is mounted to the substrate using a flip chip technology. In some embodiments, three surface acoustic wave resonators are formed on a single die end to end. A first electrode bar on the substrate connects a first surface acoustic wave resonator with a center surface acoustic wave resonator, and a second electrode bar on the substrate connects a second surface acoustic wave resonator with the center surface acoustic wave resonator. The solder balls are spaced less than 2 millimeters apart and the die is mounted to the substrate using a flip chip technology. In another embodiment, an electrode bar formed on the substrate and electrically connecting two surface acoustic wave resonators is oriented at an acute angle with respect to a main axis of the two surface acoustic wave resonators.

According to another aspect, the invention provides a method of constructing a surface acoustic wave band reject filter using a flip chip assembly technology. The method includes forming at least one of bonding pads and electrode bars on a substrate. First solder balls are formed on at least one of the substrate and a first die. A first group of at least three surface acoustic wave resonators are formed on the first die, and collectively exhibit a band reject filter response. The first die is positioned on the substrate using a flip chip technology such that the first solder balls are in contact with the at least one of bonding pads and electrode bars, the at least one of bonding pads and electrode bars electrically connecting at least one of the surface acoustic wave resonators of the first group. The at least one of the bonding pads and electrode bars are positioned such that the solder balls are not separated by more than about 2 millimeters.

In some embodiments, the method further includes forming second solder balls on at least one of the substrate and a second die. A second group of at least three surface acoustic wave resonators are formed on the second die. The second die is positioned on the substrate using the flip chip technology such that second solder balls are in contact with at least one of bonding pads and electrode bars, at least one the electrode bars electrically connecting a surface acoustic wave resonator of the first group to a surface acoustic wave resonator of the second group. In this embodiment, the first group of at least three surface acoustic wave resonators may be in a first configuration, and the second group of at least three surface acoustic wave resonators may be in a second configuration different from the first configuration. A further embodiment includes forming third solder balls on at least one of the substrate and a third die. A third group of at least three surface acoustic wave resonators are formed on the third die. The third die is positioned on the substrate using the flip chip technology such that third solder balls are in contact with at least one of bonding pads and electrode bars, at least one the electrode bars electrically connecting a surface acoustic wave resonator of the second group to a surface acoustic wave resonator of the third group. In one variation of this embodiment, the second group of at least three surface acoustic wave resonators are in a first configuration, and the third group of at least three surface acoustic wave resonators are in a second configuration different from the first configuration.

According to yet another aspect, the invention provides a surface acoustic wave band reject filter implemented as a flip chip assembly. The surface acoustic wave band reject filter includes a substrate having formed thereon at least one electrode bar and a plurality of bonding pads. A first die has formed thereon a first group of at least three surface acoustic wave resonators. At least two surface acoustic wave resonators of the first group of at least three surface acoustic wave resonators are electrically connected by one of the at least one electrode bar. The three surface acoustic wave resonators are formed on a side of the die facing the substrate and collectively exhibit a band reject filter response. First solder balls are positioned to electrically connect positions on the first die to the electrode bar and bonding pads of the substrate, such as to limit a distance between the first solder balls connecting the positions on the first die to less than about 2 millimeters.

In one embodiment according to this aspect, the surface acoustic wave band reject filter further includes a second die having formed thereon a second group of at least three surface acoustic wave resonators at least two of which are electrically connected by a second one of the at least one electrode bar. Second solder balls are positioned to electrically connect positions on the second die to an electrode bar and bonding pads of the substrate. The second solder balls are positioned such that a distance between the second solder balls does not exceed about 2 millimeters. In yet another embodiment, the first group of at least three surface acoustic wave resonators are electrically connected in a series-parallel-series configuration. Alternatively, the first group of at least three surface acoustic wave resonators are electrically connected in a parallel-series-parallel configuration.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein:

FIG. 1 is a top view of three different known SAW resonators;

FIG. 2 is a side view of three different known SAW resonators shown in FIG. 1;

FIG. 3 is a top view of a known band pass filter layout design of five SAW resonators showing positions of three solder balls that use a flip chip assembly technology;

FIG. 4 is a side view of the configuration of the band pass filter shown in FIG. 3;

FIG. 5 is block diagram of the SAW resonator configuration implemented in FIG. 3.

FIG. 6 is a diagram of a T-type configuration of SAW resonators;

FIG. 7 is a diagram of a pi-type configuration of SAW resonators;

FIG. 8 is a graph of a frequency response of the configurations shown in FIG. 6 and FIG. 7;

FIG. 9 is a block diagram of cascaded band reject filter circuit blocks;

FIG. 10 is a graph of individual overlapping adjacent frequency responses of a plurality of band reject filters circuit blocks;

FIG. 11 is a graph of a composite frequency response of a plurality of cascaded band reject filter circuit blocks;

FIG. 18 is a side view, and FIG. 19 is a top view, of an exemplary embodiment of a T-type SAW band reject filter block constructed in accordance with principles of the present invention;

FIG. 20 is block diagram of the T-type SAW resonator configuration of FIG. 19;

FIG. 21 is a diagram of the layout of the bonding pads of the configuration of FIG. 19;

FIG. 22 is a diagram of an exemplary embodiment of a SAW band reject filter constructed using three T-type SAW band reject filter blocks having the configuration shown in FIG. 19;

FIG. 23 is a diagram of the layout of the electrode bars and bonding pads of the configuration of FIG. 22;

FIG. 24 is a side view, and FIG. 25 is a top view, of an exemplary embodiment of a T-type SAW band reject filter block constructed in accordance with principles of the present invention;

FIG. 26 is block diagram of the T-type SAW resonator configuration of FIG. 25;

FIG. 27 is a diagram of the layout of the electrode bars and bonding pads of the configuration of FIG. 25;

FIG. 28 is a diagram of an exemplary embodiment of a SAW band reject filter constructed using three T-type SAW band reject filter blocks having the configuration shown in FIG. 25;

FIG. 29 is a diagram of the layout of the electrode bars and bonding pads of the configuration of FIG. 28;

FIG. 30 is a side view, and FIG. 31 is a top view, of an exemplary embodiment of a T-type SAW band reject filter block constructed in accordance with principles of the present invention;

FIG. 32 is block diagram of the T-type SAW resonator configuration of FIG. 31;

FIG. 33 is a diagram of the layout of the electrode bars and bonding pads of the configuration of FIG. 31;

FIG. 34 is a diagram of an exemplary embodiment of a SAW band reject filter constructed using three T-type SAW band reject filter blocks having the configuration shown in FIG. 31;

FIG. 35 is a diagram of the layout of the electrode bars and bonding pads of the configuration of FIG. 34;

FIG. 36 is a diagram of an exemplary alternative embodiment of a SAW band reject filter constructed using three T-type SAW band reject filter blocks having the configuration shown in FIG. 31;

FIG. 37 is a diagram of the layout of the electrode bars and bonding pads of the configuration of FIG. 36;

FIG. 38 is a side view, and FIG. 39 is a top view, of an exemplary embodiment of a pi-type SAW band reject filter block constructed in accordance with principles of the present invention;

FIG. 40 is block diagram of the pi-type SAW resonator configuration of FIG. 39;

FIG. 41 is a diagram of the layout of the electrode bars and bonding pads of the configuration of FIG. 39;

FIG. 46 is a side view, and FIG. 47 is a top view, of an exemplary embodiment of a pi-type SAW band reject filter block constructed in accordance with principles of the present invention;

FIG. 48 is block diagram of the pi-type SAW resonator configuration of FIG. 47;

FIG. 49 is a diagram of the layout of the electrode bars and bonding pads of the configuration of FIG. 47;

FIG. 50 is a diagram of an exemplary embodiment of a SAW band reject filter constructed using three pi-type SAW band reject filter blocks having the configuration shown in FIG. 47;

FIG. 51 is a diagram of the layout of the electrode bars and bonding pads of the configuration of FIG. 50;

FIG. 54 is a side view, and FIG. 55 is a top view, of an exemplary embodiment of a pi-type SAW band reject filter block constructed in accordance with principles of the present invention;

FIG. 64 is a diagram of an exemplary embodiment of a SAW band reject filter constructed using three pi-type SAW band reject filter blocks having the configuration shown in FIG. 61;

FIG. 65 is a diagram of the layout of the electrode bars and bonding pads of the configuration of FIG. 64;

FIG. 66 is a diagram of an exemplary alternative embodiment of a SAW band reject filter constructed using three pi-type SAW band reject filter blocks having the configuration shown in FIG. 61;

FIG. 67 is a diagram of the layout of the electrode bars and bonding pads of the configuration of FIG. 66;

FIG. 68 is a side view, and FIG. 69 is a top view, of an exemplary embodiment of a pi-type SAW band reject filter block constructed in accordance with principles of the present invention;

FIG. 70 is block diagram of the pi-type SAW resonator configuration of FIG. 69;

FIG. 71 is a diagram of the layout of the electrode bars and bonding pads of the configuration of FIG. 69;

FIG. 72 is a diagram of an exemplary embodiment of a SAW band reject filter constructed using three pi-type SAW band reject filter blocks having the configuration shown in FIG. 69;

FIG. 73 is a diagram of the layout of the electrode bars and bonding pads of the configuration of FIG. 72;

DETAILED DESCRIPTION OF THE INVENTION

Figure 15:
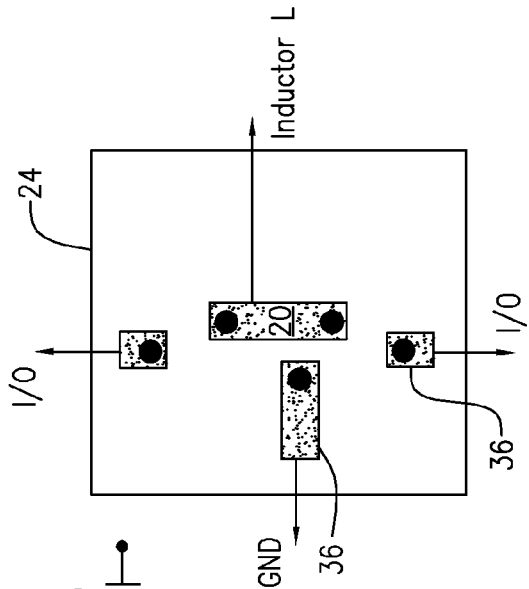
FIG. 15 is a diagram of the layout of the electrode bars and bonding pads of the configuration of FIG. 13.

Before describing in detail exemplary embodiments that are in accordance with the present invention, it is noted that the embodiments reside primarily in combinations of apparatus components and processing steps related to providing a surface acoustic wave (SAW) band reject filter. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Embodiments described herein employ a plurality of SAW resonators for a band reject filter that use electrode bars formed on the substrate to electrically connect the SAW resonators. By forming the electrode bars on the substrate, the electrode bars can be shorter than the bus bars that are formed on the die of the SAW resonators as in known designs. This reduces loss and parasitic inductance that would otherwise be presented by the bus bars formed on the die. Also, by placing the electrode bars on the substrate, the SAW resonators can be placed closer together, thereby reducing the size of the die needed to construct a band reject filter. Because the size of the die is reduced, flip chip assembly technology—where the surface of the die faces the substrate and solder balls are used to electrically connect the circuit of the die and the electrodes of the substrate—can be used for ease and reliability of SAW band reject filter manufacture.

Referring again to the drawing figures, there is shown in FIG. 6 a block diagram 28 of a T-type configuration of SAW resonators 10,—or series-parallel-series configuration of SAW resonators 10. FIG. 7 is a pi-type configuration 30 of three SAW resonators 10—or parallel-series-parallel. Each SAW resonator 10 may be one of the SAW resonators shown in FIGS. 1 and 2. The inductors L, L1 and L2 may be used to match their respective SAW band reject filter circuit . Each SAW band reject filter circuit block may have a reject band response 32, as shown in FIG. 8.

FIG. 9 is a block diagram of cascaded SAW band reject filter circuit blocks 28, 30 constructed in accordance with principles of the present invention. The SAW band reject filter circuit blocks 28, 30 are well-matched in their upper and/or lower pass bands through their respective inductors L, L1, and L2 as shown in FIGS. 6 and 7 In one embodiment, each SAW band reject filter circuit block 28, 30 has a band reject filter response 32, as shown in FIG. 10. FIG. 10 shows that the SAW band reject filter circuit block frequency responses may be adjacent and partially overlap. If the SAW band reject filter circuit blocks 28, 30 are well matched, then FIG. 11 is a graph of a resultant frequency response 33 of cascaded SAW band reject filter circuit blocks having the responses 32 shown in FIG. 10. The overall bandwidth of the reject band region of FIG. 11 depends on the number N of individual SAW band reject filter circuit blocks 28, 30.

Figure 14:
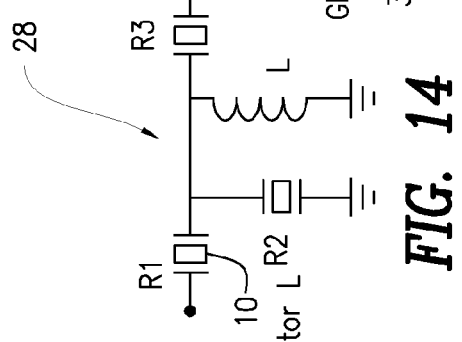
FIG. 14 is block diagram of the T-type SAW resonator configuration of FIG. 13.
Figure 12:
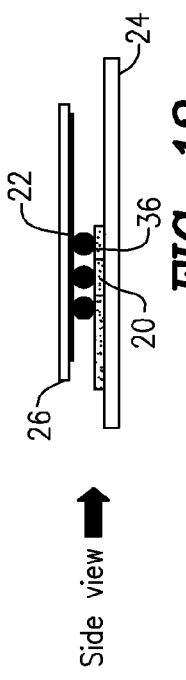
FIG. 12 is a side view.
Figure 13:
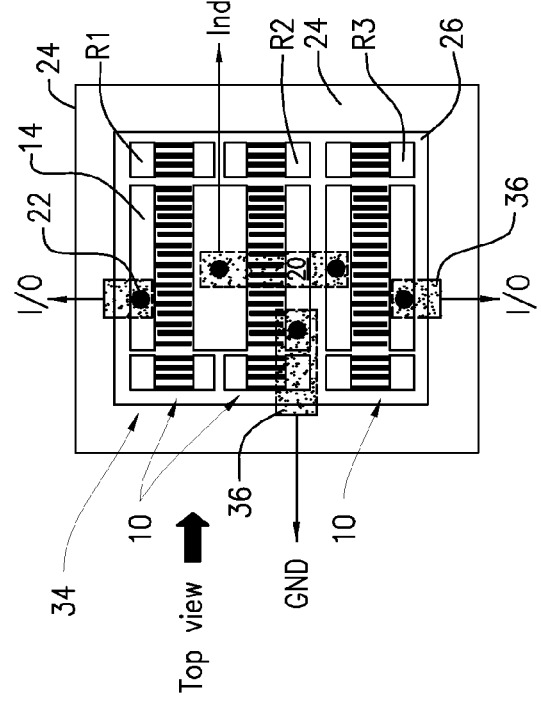
FIG. 13 is a top view, of an exemplary embodiment of a T-type SAW band reject filter block constructed in accordance with principles of the present invention.

FIG. 12 is a side view, and FIG. 13 is a top view, of an exemplary embodiment of a SAW band reject filter block 34 constructed in accordance with principles of the present invention. The SAW band reject filter block 34 includes 3 SAW resonators 10 formed on a die 26 in a T-type configuration of a SAW band reject filter circuit block, as shown in the block diagram of FIG. 14. The die 26 is affixed to a substrate 24 with the SAW band reject filter electrodes on the die facing the substrate 24, such that solder balls 22 formed on the die 26 engage electrode pads/bars 36 that are formed on the substrate 24. In an alternative embodiment, the solder balls may be formed on the substrate 24 and engage the SAW band reject filter electrodes formed on the die 26 and facing the electrode pads/bars 36 formed on the substrate 24. Particularly, electrode bars 20 formed on the substrate 24 electrically connect the top two SAW resonators 10 to the lower SAW resonator 10. FIG. 15 also shows the position of the electrode pads/bars separately for clarity. By forming the connecting electrode bar 20 on the substrate 24, rather than on the die 26, the connecting bar between resonators can be shorter, thereby reducing loss and reducing parasitic inductance. Also, placing the electrode bar 20 on the substrate 24 allows the three SAW resonators 10 to be placed closer together, resulting in a smaller die required to implement the SAW band reject filter block 34 using the flip chip assembly technology.

Figure 17:
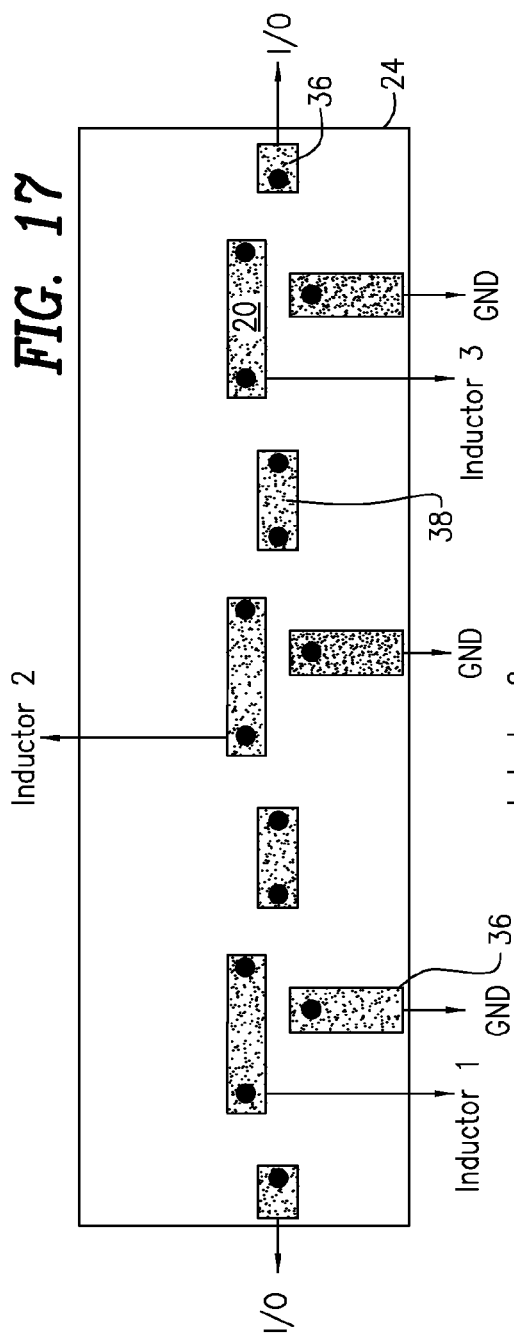
FIG. 17 is a diagram of the layout of the electrode bars and bonding pads of the configuration of FIG. 16.
Figure 16:
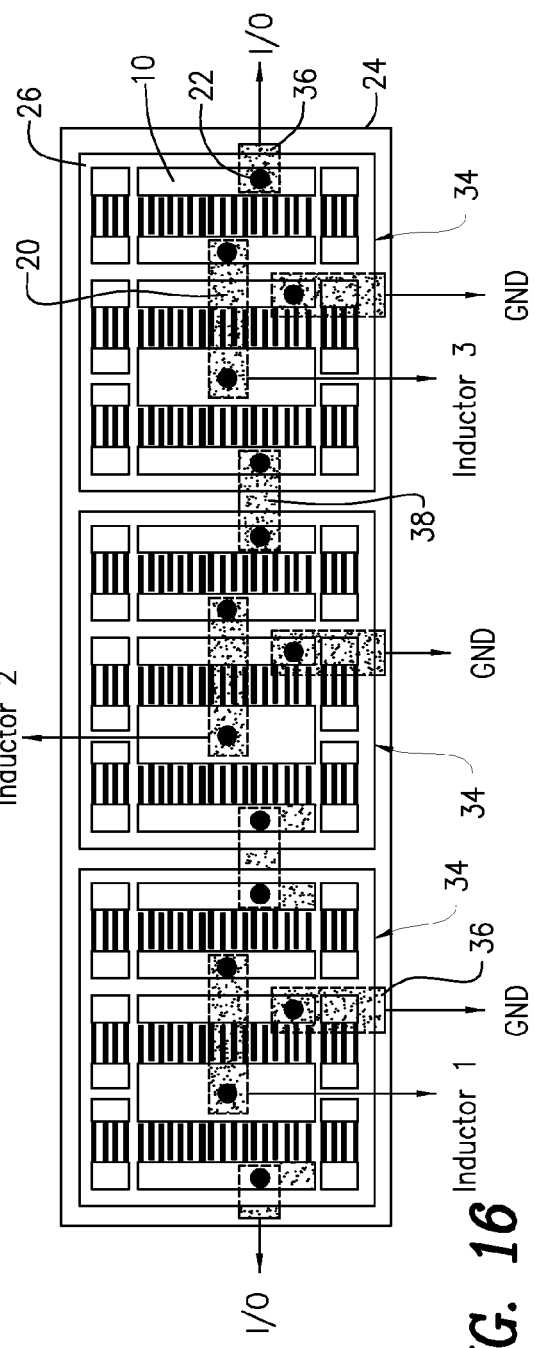
FIG. 16 is a diagram of an exemplary embodiment of a SAW band reject filter constructed using three T-type SAW band reject filter blocks having the configuration shown in FIG. 13.

FIG. 16 is a diagram of an exemplary embodiment of a SAW band reject filter constructed using three SAW band reject filter blocks having the configuration shown in FIG. 13. The SAW band reject filter blocks 34 are electrically connected by electrode bars 38. FIG. 17 is a diagram of the layout of the electrode bars and bonding pads of the configuration of FIG. 16. Note that each SAW band reject filter block 34 is formed on a separate die 26, thereby reducing effects of thermal mismatch between the die 26 and the substrate 24. Note that the electrode bars 20, 38 and pads 36 formed on the substrate 24 engage solder balls 22 of the die 26 to provide electrical connections between the SAW band reject filter blocks and external inductors L1, L2, and L3 and ground, as well as to provide input/output IO ports. Also note that the solder balls can be formed on the substrate to provide the same electrical connections between the SAW band reject filter blocks and the electrode bars/pads formed on the substrate.

FIG. 18 is a side view, and FIG. 19 is a top view, of an alternative exemplary embodiment of a SAW band reject filter block constructed in accordance with principles of the present invention. This SAW band reject filter block 34 includes three SAW resonators 10 formed on a die 26 in a T-type configuration of the SAW band reject filter circuit block, as shown in FIG. 20. In FIG. 19, the IDT bus bars 14 of adjacent SAW resonators 10 are in electrical contact on the die 26, so that no electrode bars on the substrate 24 are needed to electrically connect the adjacent SAW resonators 10. FIG. 21 is a diagram of the layout of the bonding pads of the configuration of FIG. 19. Pads 36 formed on the substrate 24 engage solder balls 22 of the die 26 to provide connections between the SAW resonators and external inductors L, input/output, I/O, ports and ground. Also note that the solder balls can be formed on the substrate instead of being formed on the die in order to play the same connecting role as described above.

Close placement of the SAW resonators, as shown in FIG. 19, is possible because a SAW resonator for a band reject filter design typically has more than 100 reflector fingers that nearly completely enclose the surface acoustic waves that are generated by the interdigital transducer (IDT) fingers of the SAW resonator within its respective layout area. This reduces or prevents leakage of the surface acoustic waves from one SAW resonator to another. In contrast, SAW resonators used in band pass filters have only about 20 reflector fingers, which are not enough to prevent surface acoustic wave leakage from the SAW resonators, so that the SAW resonators of the band pass filter design should be placed in parallel as shown in FIG. 3.

FIG. 22 is a diagram of an exemplary embodiment of a SAW band reject filter constructed using three SAW band reject filter blocks having the configuration shown in FIG. 13. FIG. 23 is a diagram of the layout of the electrode bars and bonding pads of the configuration of FIG. 22. Two electrode bars 38 formed on the substrate 24 electrically connect the upper two SAW band reject filter blocks 34a and 34b and a single electrode bar 38 electrically connects the lower two SAW band reject filter blocks 34b and 34c.

FIG. 24 is a side view, and FIG. 25 is a top view, of an exemplary embodiment of a SAW band reject filter block 34 constructed in accordance with principles of the present invention. The SAW band reject filter block 34 includes three SAW resonators 10 formed on a die in a T-type configuration of the SAW band reject filter block, as shown in FIG. 26. In FIG. 25, the three SAW resonators 10 are electrically connected by a T-shaped electrode bar 40 that is formed on the substrate 24. The IDT bus bars of the three SAW resonators 10 are not in electrical contact on the die, unlike the embodiment of FIG. 19. The embodiment of FIG. 25 has a lower insertion loss than the embodiment of FIG. 19, since the electrode bar 40 formed on the substrate presents a lower resistance than the connected IDT bus bars 14. FIG. 27 is a diagram of the layout of the electrode bars and bonding pads of the configuration of FIG. 25. Note that the electrode bar 40 can be rectangular or shape other than a T shape. FIG. 28 is a diagram of an exemplary embodiment of a SAW band reject filter constructed using three SAW band reject filter blocks having the configuration shown in FIG. 25. FIG. 29 is a diagram of the layout of the electrode bars and bonding pads of the configuration of FIG. 28

FIG. 30 is a side view, and FIG. 31 is a top view, of yet another exemplary embodiment of a SAW band reject filter block constructed in accordance with principles of the present invention. The SAW band reject filter block includes three SAW resonators 10 formed on a die in a T-type configuration of the SAW band reject filter circuit block, as shown in FIG. 32. In FIG. 31, the two resonators on the left, 10a and 10b, are electrically connected through their IDT bus bars 14 on the die. The top two resonators, 10a and 10c, are electrically connected through an electrode bar that 20 that is formed on the substrate 24. FIG. 33 is a diagram of the layout of the electrode bars and bonding pads of the configuration of FIG. 31.

FIG. 34 is a diagram of an exemplary embodiment of a SAW band reject filter constructed using three SAW band reject filter blocks 34a, b and c having the configuration shown in FIG. 31. In FIG. 34, the three filter blocks are electrically connected using two electrode bars 40 formed on the substrate 24. FIG. 35 is a diagram of the layout of the electrode bars and bonding pads of the configuration of FIG. 34. FIG. 36 is a diagram of an alternative exemplary embodiment of a SAW band reject filter constructed using three SAW band reject filter blocks having the configuration shown in FIG. 31. In FIG. 36, the three filter blocks are also electrically connected using two electrode bars 40 formed on the substrate 24. FIG. 37 is a diagram of the layout of the electrode bars and bonding pads of the configuration of FIG. 36

FIG. 38 is a side view, and FIG. 39 is a top view, of an exemplary embodiment of a pi-type SAW band reject filter block constructed in accordance with principles of the present invention. The pi-type SAW band reject filter block also includes three SAW resonators 10 formed on a die in pi-type configuration of the SAW band reject filter circuit block, as shown in FIG. 40. In FIG. 39, the left and center SAW resonators, 10a and 10b, are electrically connected by a bus bar 42 formed on the die that makes electrical contact with the IDT bus bars 14. The center and right SAW resonators, 10b and 10c, are also electrically connected by another bus bar 42 formed on the die that makes electrical contact with the IDT bus bars 14. FIG. 41 is a diagram of the layout of the electrode bars and bonding pads of the configuration of FIG. 39.

Figures 42, 43:
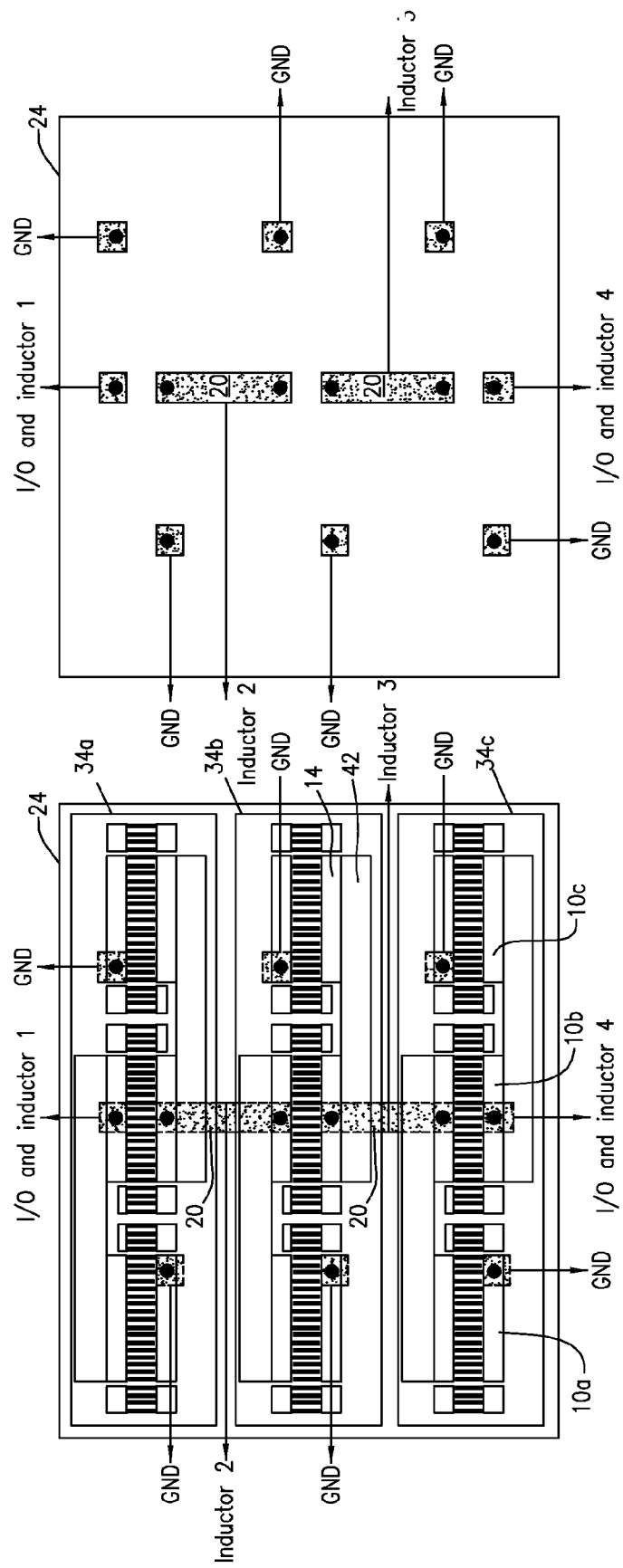
FIG. 42 is a diagram of an exemplary embodiment of a SAW band reject filter constructed using three pi-type SAW band reject filter blocks having the configuration shown in FIG. 39.
FIG. 43 is a diagram of the layout of the electrode bars and bonding pads of the configuration of FIG. 42.
Figure 45:
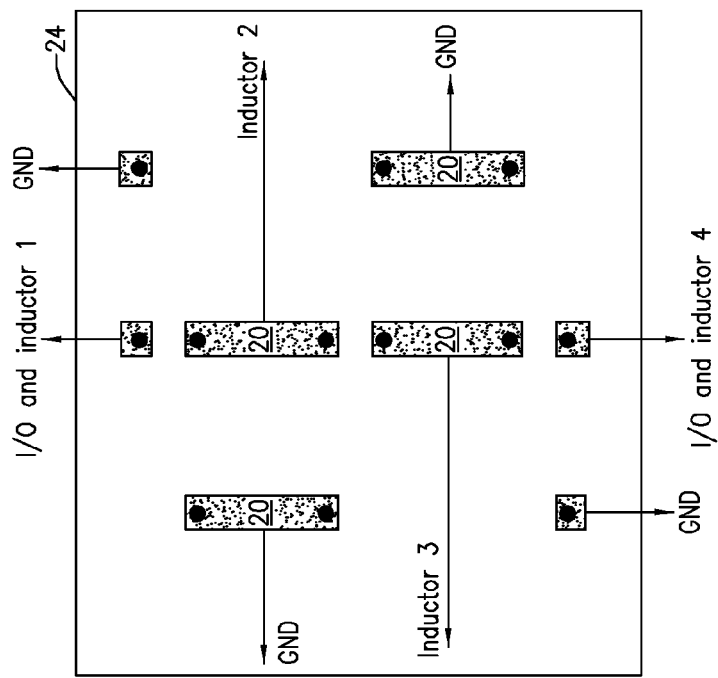
FIG. 45 is a diagram of the layout of the electrode bars and bonding pads of the configuration of FIG. 44.
Figure 44:
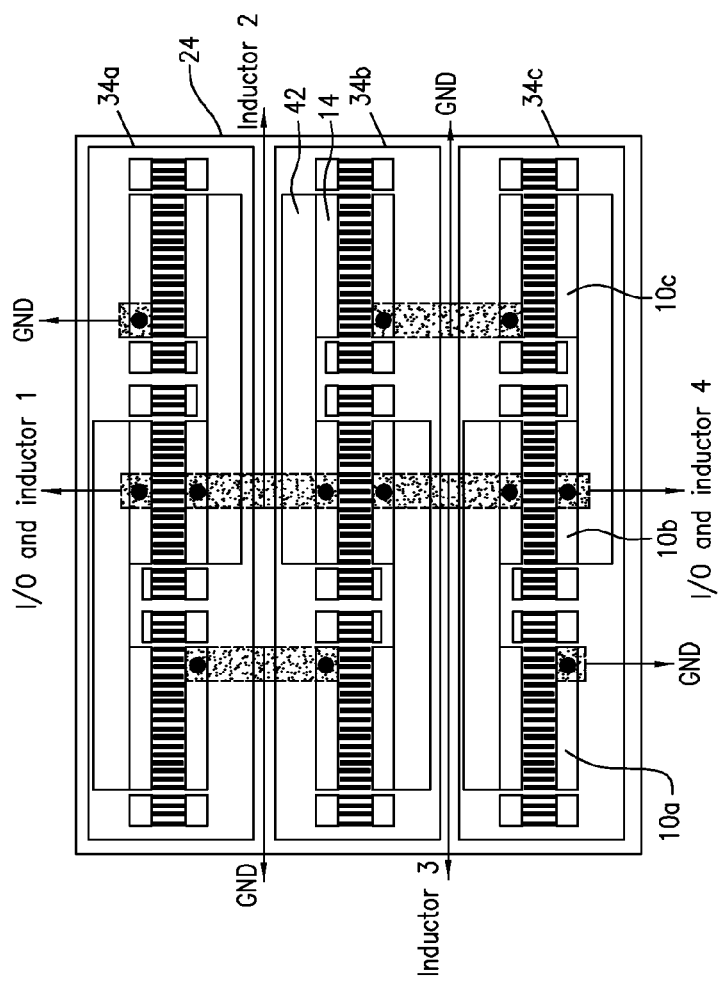
FIG. 44 is a diagram of an exemplary alternative embodiment of a SAW band reject filter constructed using three pi-type SAW band reject filter blocks having the configuration shown in FIG. 39.

FIGS. 42 and 44 are diagrams of two alternative embodiments of SAW band reject filters constructed using SAW band reject filter blocks having the configuration shown in FIG. 39. The three blocks are electrically connected to each other through two long electrode bars 20 in FIG. 42, and four long electrode bars 20 in FIG. 44, that are formed on the substrate 24. FIG. 43 is a diagram of the layout of the electrode bars and bonding pads of the configuration of FIG. 42. FIG. 45 is a diagram of the layout of the electrode bars and bonding pads of the configuration of FIG. 44.

FIG. 46 is a side view, and FIG. 47 is a top view, of an alternative exemplary embodiment of a pi-type SAW band reject filter block constructed in accordance with principles of the present invention. The pi-type SAW band reject filter block includes three SAW resonators 10 formed on a die in pi-type configuration of the SAW band reject filter circuit block, as shown in FIG. 48. In FIG. 47, the SAW resonators are electrically connected by two long electrode bars 42 formed on the substrate, but the SAW resonators are not otherwise electrically connected to each other. FIG. 49 is a diagram of the layout of the electrode bars and bonding pads of the configuration of FIG. 47.

Figure 52:
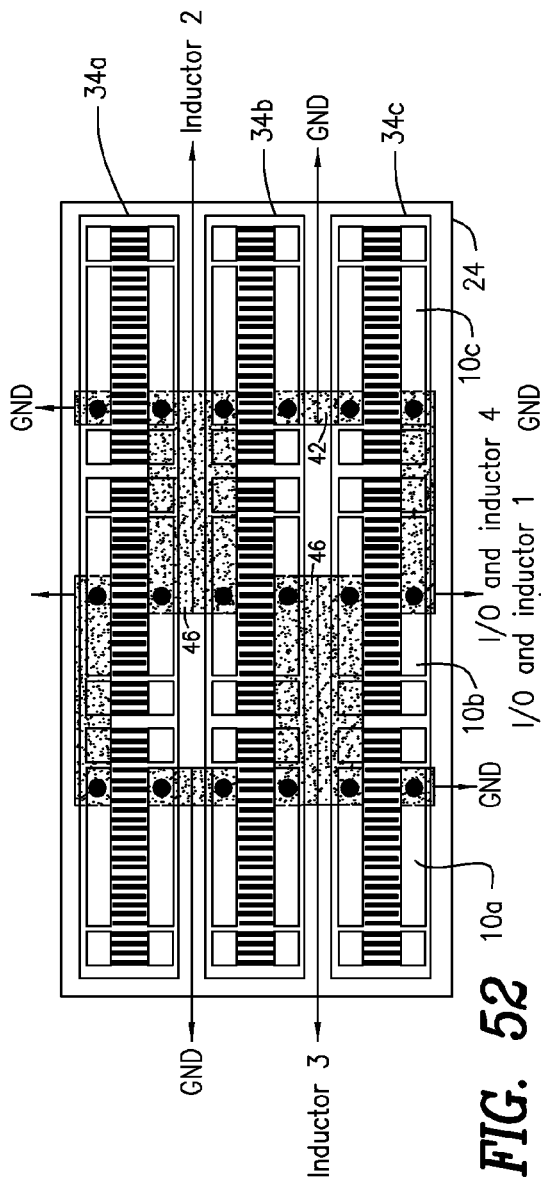
FIG. 52 is a diagram of an exemplary alternative embodiment of a SAW band reject filter constructed using three pi-type SAW band reject filter blocks having the configuration shown in FIG. 47.
Figure 53:
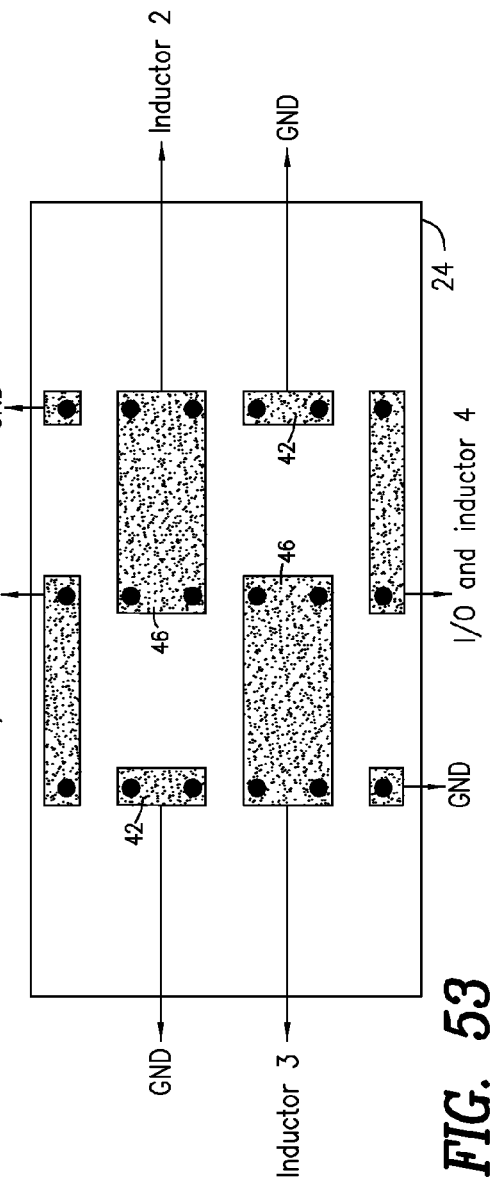
FIG. 53 is a diagram of the layout of the electrode bars and bonding pads of the configuration of FIG. 52.

FIGS. 50 and 52 are diagrams of two alternative embodiments of SAW band reject filters constructed using three SAW band reject filter blocks having the configuration shown in FIG. 47. In FIG. 50, three SAW band reject filter blocks are electrically connected by Z shaped electrode bars 44 that are formed on the substrate 24. Note that the electrode bars 44 are not limited to the Z shape and other shapes can be used. In FIG. 52, two large electrode bars 46 and two small electrode bars 42, formed on the substrate 24, electrically connect the three SAW band reject filter blocks. FIG. 51 is a diagram of the layout of the electrode bars and bonding pads of the configuration of FIG. 50. FIG. 53 is a diagram of the layout of the electrode bars and bonding pads of the configuration of FIG. 52.

Figures 56, 57:
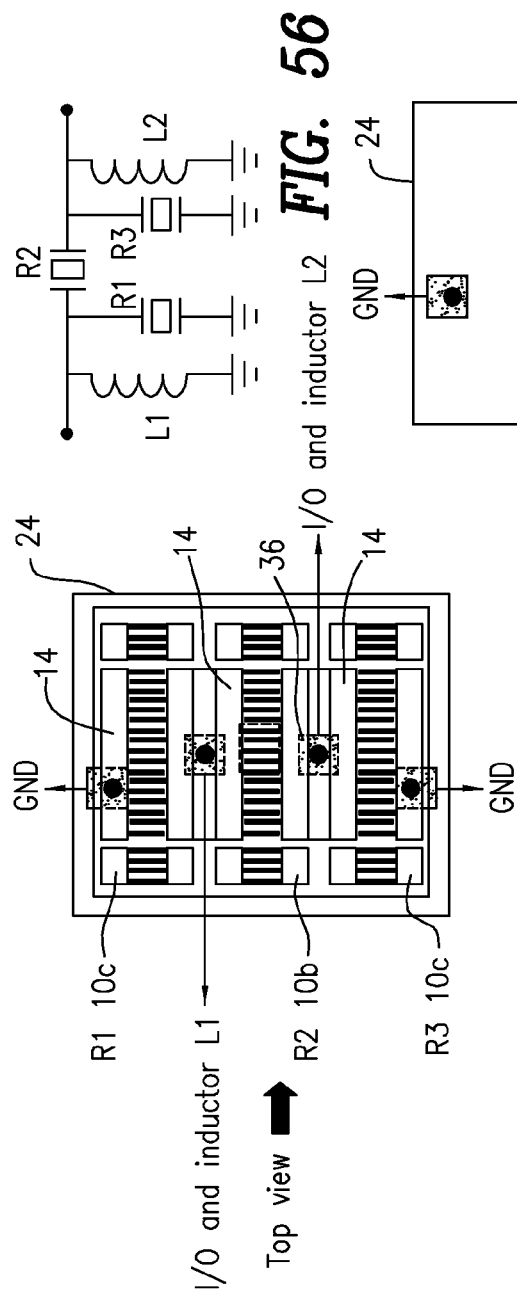
FIG. 56 is block diagram of the pi-type SAW resonator configuration of FIG. 55.
FIG. 57 is a diagram of the layout of the electrode bars and bonding pads of the configuration of FIG. 55.
Figure 58:
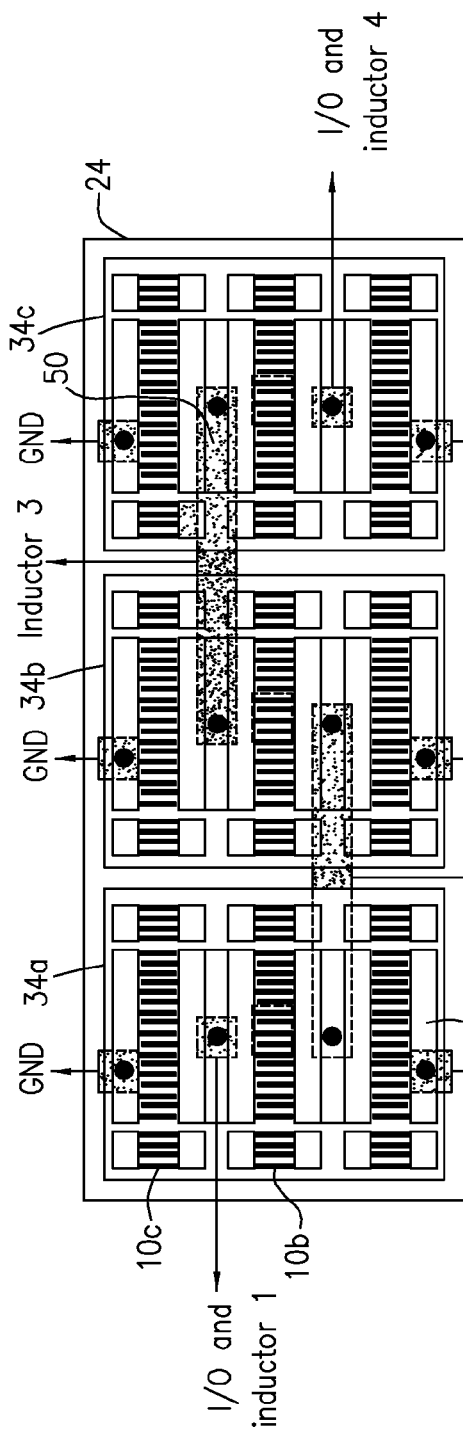
FIG. 58 is a diagram of an exemplary embodiment of a SAW band reject filter constructed using three pi-type SAW band reject filter blocks having the configuration shown in FIG. 55.
Figure 59:
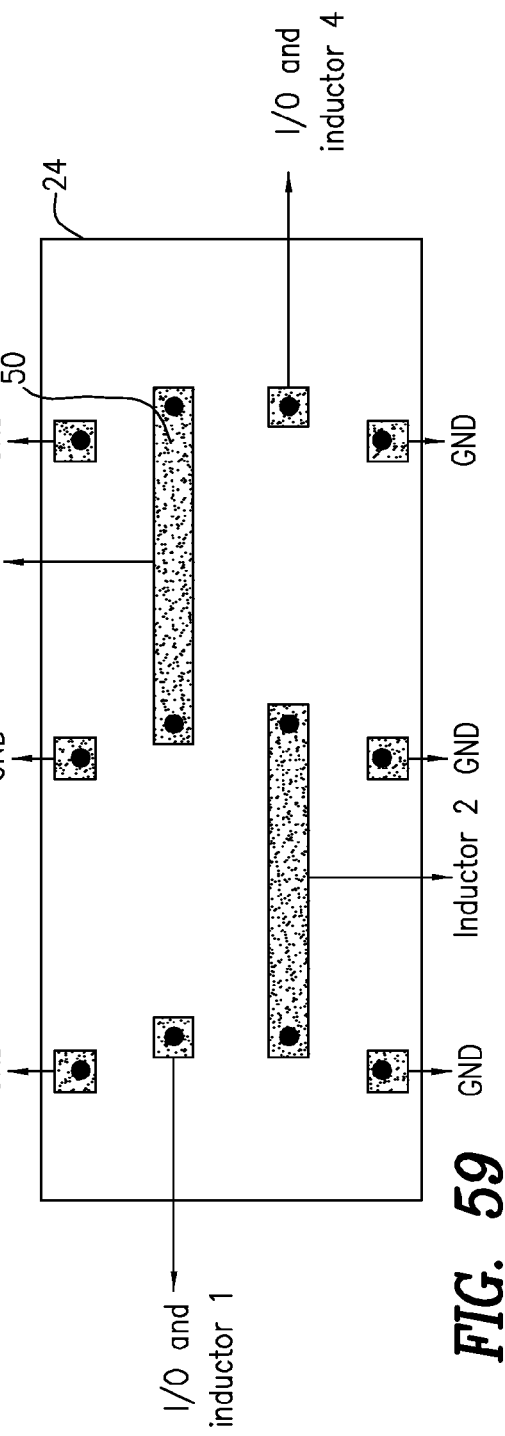
FIG. 59 is a diagram of the layout of the electrode bars and bonding pads of the configuration of FIG. 58.

FIG. 54 is a side view, and FIG. 55 is a top view, of an alternative exemplary embodiment of a pi-type SAW band reject filter block constructed in accordance with principles of the present invention, and as shown in FIG. 56. In FIG. 55, the adjacent SAW resonators IDT bus bars 14 are electrically connected to each other on the die. The pi-type SAW band reject filter block is electrically connected to the external inductors, L1, L2, ground and I/O ports through the solder balls and the electrode pads 36 formed on the substrate 24. FIG. 57 is a diagram of the layout of the electrode bars and bonding pads of the configuration of FIG. 55. FIG. 58 is a diagram of an embodiment of a SAW band reject filter constructed using three pi-type SAW band reject filter blocks 34a, b and c, having the configuration shown in FIG. 55. The three pi-type SAW band reject filter blocks are electrically connected by two long electrode bars 50 that are formed on the substrate 24. FIG. 59 is a diagram of the layout of the electrode bars and bonding pads of the configuration of FIG. 58.

Figure 62:
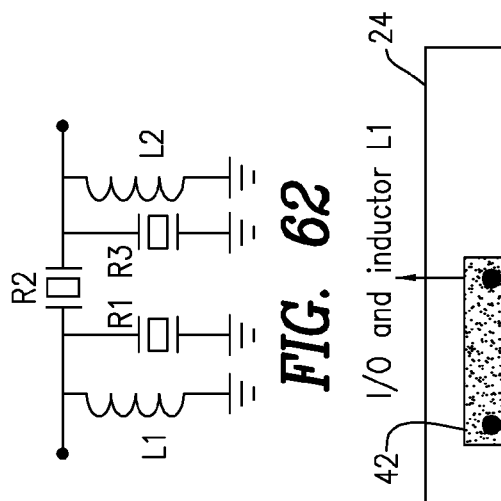
FIG. 62 is block diagram of the pi-type SAW resonator configuration of FIG. 61.
Figure 63:
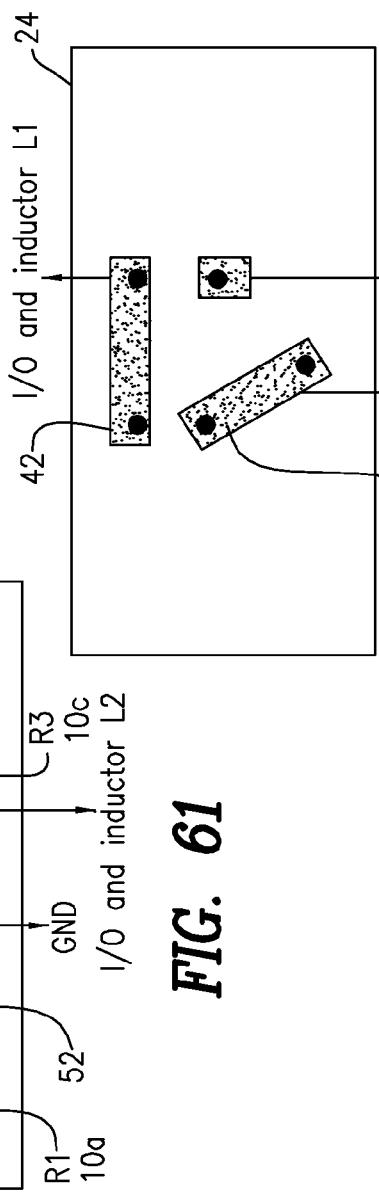
FIG. 63 is a diagram of the layout of the electrode bars and bonding pads of the configuration of FIG. 61.
Figure 60:
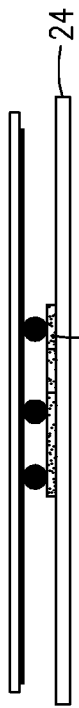
FIG. 60 is a side view.
Figure 61:
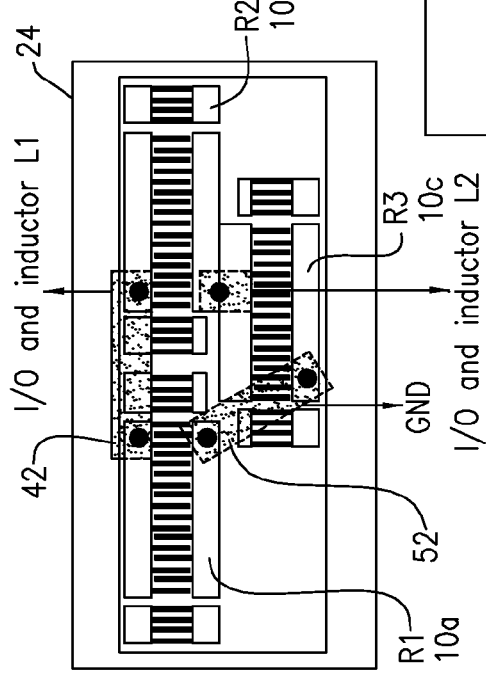
FIG. 61 is a top view, of an exemplary embodiment of a pi-type SAW band reject filter block constructed in accordance with principles of the present invention.

FIG. 60 is a side view, and FIG. 61 is a top view, of an alternative exemplary embodiment of a pi-type SAW band reject filter block constructed in accordance with principles of the present invention, and as shown in FIG. 62. In FIG. 61, the two upper SAW resonators are electrically connected by an electrode bar 42 formed on the substrate and having an axis along the axis of the substrate 24. The upper left SAW resonator is electrically connected to the lower SAW resonator by an electrode bar 52 formed on the substrate 24 that makes an acute angle with respect to the long axis of the substrate. FIG. 63 is a diagram of the layout of the electrode bars and bonding pads of the configuration of FIG. 61.

FIGS. 64 and 66 are diagrams of embodiments of SAW band reject filters constructed using three pi-type SAW band reject filter block having the configuration shown in FIG. 61. In FIG. 64, two L-shaped electrode bars 54 formed on the substrate 24 electrically connect the three pi-type SAW band reject filter blocks. In FIG. 66, the top two pi-type SAW band reject filter blocks 34a and b are electrically connected by a long electrode bar 42 and a curved electrode bar 58, both formed on the substrate 24, and the bottom two SAW band reject filter blocks 34b and c are electrically connected by large electrode bar 56 formed on the substrate 24. FIG. 65 is a diagram of the layout of the electrode bars and bonding pads of the configuration of FIG. 64. FIG. 67 is a diagram of the layout of the electrode bars and bonding pads of the configuration of FIG. 66

FIG. 68 is a side view, and FIG. 69 is a top view, of an alternative exemplary embodiment of a pi-type SAW band reject filter block constructed in accordance with principles of the present invention, and as shown in FIG. 70. In FIG. 69, the two upper SAW resonators 10a and 10b are electrically connected by a long bus bar 58 formed on the die and making electrical contact with the IDT bus bars 14 of the two upper SAW resonators. The upper left SAW resonator 10a is electrically connected to the lower SAW resonator 10c by an electrode bar 52 formed on the substrate that makes an acute angle with respect to the long axis of the substrate. FIG. 71 is a diagram of the layout of the electrode bars and bonding pads of the configuration of FIG. 69.

Figure 74:
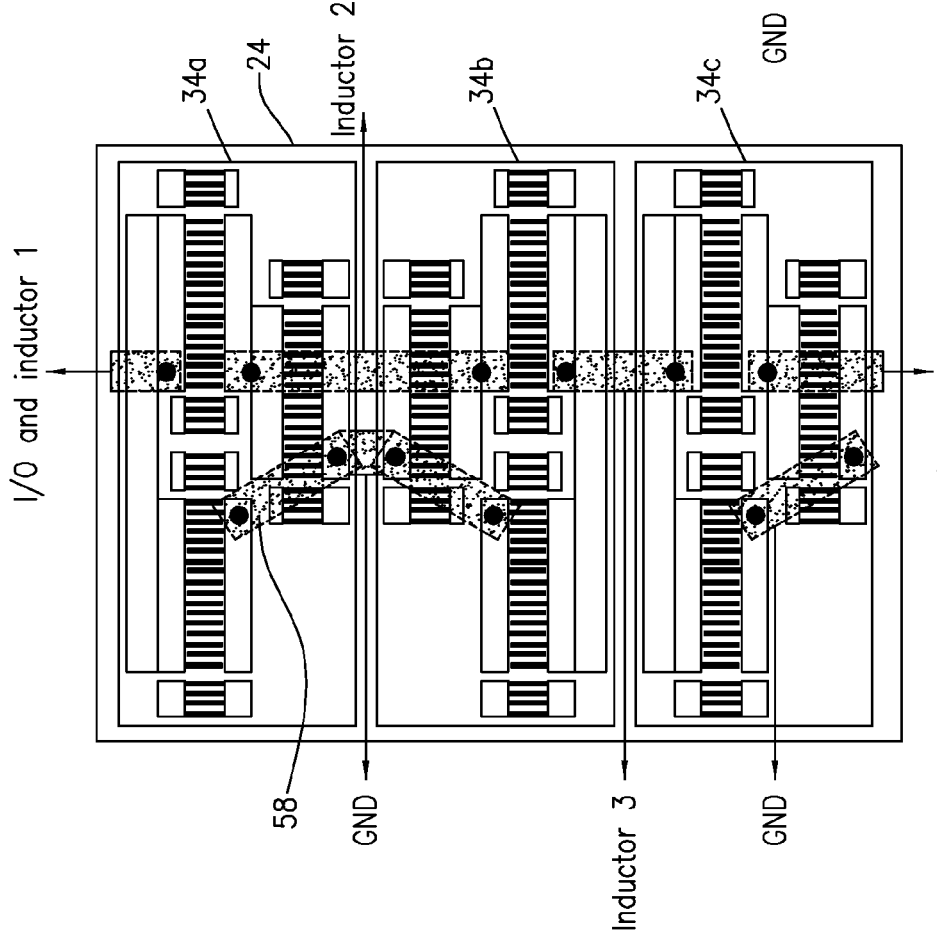
FIG. 74 is a diagram of an exemplary alternative embodiment of a SAW band reject filter constructed using three pi-type SAW band reject filter blocks having the configuration shown in FIG. 69.

FIGS. 72 and 74 are diagrams of embodiments of SAW band reject filters constructed using three pi-type SAW band reject filter blocks having the configuration shown in FIG. 38.

Figure 75:
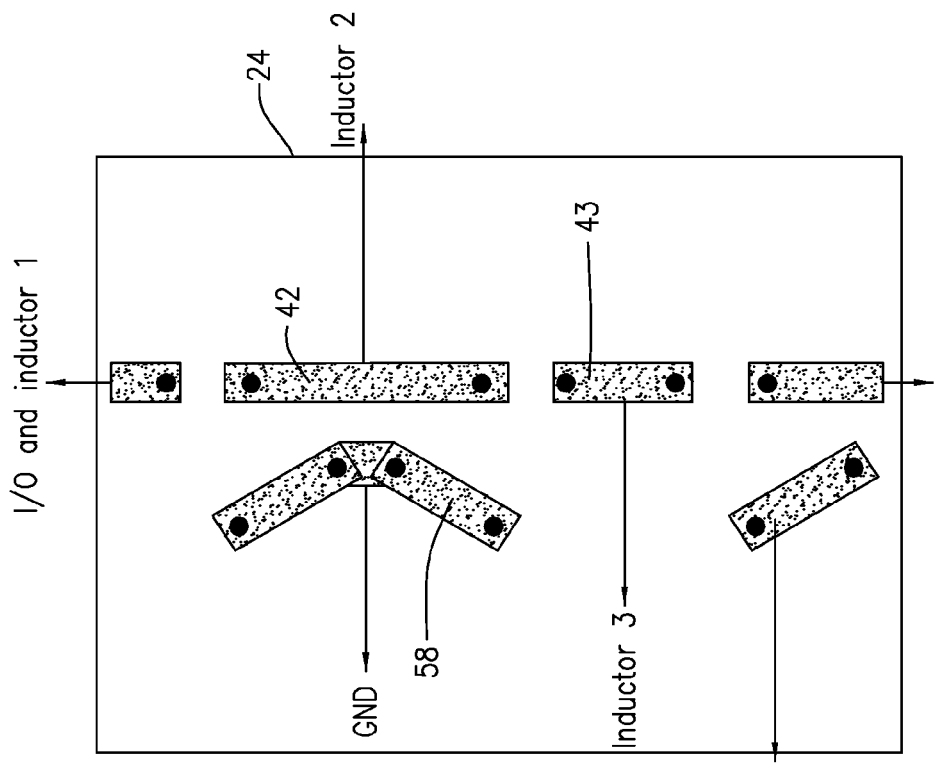
FIG. 75 is a diagram of the layout of the electrode bars and bonding pads of the configuration of FIG. 74.

In FIG. 72, two long electrode bars 42 formed on the substrate electrically connect the three SAW band reject filter blocks In FIG. 74, a long electrode bar 42 and a curved electrode bar 58, both formed on the substrate 24, electrically connect the upper two SAW band reject filter blocks 34a and 34b. A short electrode bar 43 formed on the substrate electrically connects the middle and lower SAW band reject filter blocks 34b and 34c. FIG. 73 is a diagram of the layout of the electrode bars and bonding pads of the configuration of FIG. 72. FIG. 75 is a diagram of the layout of the electrode bars and bonding pads of the configuration of FIG. 74.

Note that in FIGS. 16, 22, 28, 34, 36, 42, 44, 50, 52, 58, 64, 66, 72 and 74, only three SAW band reject filter blocks are used to construct a SAW band reject filter. However, the number of the SAW band reject filter blocks used to construct the SAW band reject filter should not be limited to 3, and depending on band reject filter performance requirements, the number of the SAW band reject filter blocks used to construct the band reject filter can be 2 or more than 3. Also, the SAW band reject filter blocks shown in FIGS. 13, 19, 25, 31, 39, 47, 55, 61 and 69 can be mixed and combined to construct the SAW band reject filter over the same substrate if preferred.

Flip chip type SAW assembly technology can be applied as described herein, because the placement of electrode bars on the substrate enables compact layout design of SAW band reject filter blocks on a single die that may have a largest dimension of less than about 3.0 millimeters. As such, the distance between any two solder balls that make electrical connections between the die and the substrate may be no greater than about 2.0 millimeters, thereby minimizing effects due to thermal mismatch between the die and the substrate. SAW band reject filters as described herein enable building radio frequency, RF, front ends of radios smaller and with lower cost. Note that different ones of the embodiments described herein may have different numbers of electrode pads/bars.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A surface acoustic wave band reject filter, comprising:
a substrate, the substrate including electrode bars and bonding pads formed on the substrate; and
at least one die having a side facing the substrate;
at least three surface acoustic wave resonators, all of the surface acoustic wave resonators being formed on the at least one die, the at least one die mounted on the substrate;
solder balls in contact with the side of the at least one die facing the substrate, the solder balls positioned to be in electrical contact with the electrode bars and bonding pads on the substrate, the at least three surface acoustic wave resonators being connected by the electrode bars and bonding pads via the solder balls and collectively exhibiting a band reject filter response;
all of the surface acoustic wave resonators formed on a single die of the at least one die being adjacent and geometrically aligned so that main axes oriented along a length of each of the surface acoustic wave resonators are one of parallel and coincident.

2. The surface acoustic wave band reject filter of claim 1, wherein three of the surface acoustic wave resonators are arranged so that two of the three surface acoustic wave resonators are electrically in series, and the third surface acoustic wave resonator is electrically in parallel to and between the other two of the three surface acoustic wave resonators.

3. The surface acoustic wave band reject filter of claim 2, wherein the three surface acoustic wave resonators are formed on a single die.

4. The surface acoustic wave band reject filter of claim 3, wherein at least two of the three adjacent surface acoustic wave resonators share a common bus bar on the die.

5. The surface acoustic wave band reject filter of claim 1, wherein a first two of three surface acoustic wave resonators are positioned end to end and wherein the third surface acoustic wave resonator is adjacent to and straddles the first two surface acoustic wave resonators.

6. The surface acoustic wave band reject filter of claim 5, wherein an electrode bar on the substrate connects bus bars of the first two of the three surface acoustic wave resonators.

7. The surface acoustic wave band reject filter of claim 1, wherein a first three of the at least three surface acoustic wave resonators are arranged such that a first two of the three surface acoustic wave resonators are electrically in parallel, and the third surface acoustic wave resonator is electrically intervening between the first two surface acoustic wave resonators.

8. The surface acoustic wave band reject filter of claim 1, wherein a first two of three surface acoustic wave resonators are mounted end to end, and the third surface acoustic wave resonator is adjacent to one of the first two surface acoustic wave resonators.

9. The surface acoustic wave band reject filter of claim 1, wherein three of the at least three surface acoustic wave resonators are formed end to end, having a first connecting bus bar connecting a first surface acoustic wave resonator with a center surface acoustic wave resonator, and having a second connecting bus bar connecting a second surface acoustic wave resonator with the center surface acoustic wave resonator.

10. The surface acoustic wave band reject filter of claim 1, wherein three of the at least three surface acoustic wave resonators are formed end to end, having a first electrode bar on the substrate connecting a first surface acoustic wave resonator with a center surface acoustic wave resonator, and having a second electrode bar on the substrate connecting a second surface acoustic wave resonator with the center surface acoustic wave resonator.

11. The surface acoustic wave band reject filter of claim 1, wherein an electrode bar formed on the substrate and electrically connecting two surface acoustic wave resonators is oriented at an acute angle with respect to a main axis of the two surface acoustic wave resonators so that one of the three surface acoustic wave resonators is offset from a line of symmetry between the other two of the three surface acoustic wave resonators.

12. A method of constructing a surface acoustic wave band reject filter, the method comprising:
    forming at least one of bonding pads and electrode bars on a substrate;
    forming first solder balls on at least one of the substrate and a first die;
    forming a first group of at least three surface acoustic wave resonators on the first die and collectively exhibiting a band reject filter response, all of the surface acoustic resonators formed on the first die being adjacent and geometrically aligned so that main axes oriented along a length of each of the surface acoustic wave resonators are one of parallel and coincident; and
    positioning the first die on the substrate such that first solder balls are in contact with the at least one of bonding pads and electrode bars, the at least one of bonding pads and electrode bars electrically connecting at least one of the surface acoustic wave resonators of the first group.

13. The method of claim 12, further comprising:
    forming second solder balls on at least one of the substrate and a second die;
    forming a second group of at least three surface acoustic wave resonators on the second die; and
    positioning the second die on the substrate such that second solder balls are in contact with at least one of bonding pads and electrode bars, at least one of a bonding pad and electrode bar electrically connecting a surface acoustic wave resonator of the first group to a surface acoustic wave resonator of the second group.

14. The method of claim 13, wherein the first group of at least three surface acoustic wave resonators are in a first configuration, and the second group of at least three surface acoustic wave resonators are in a second configuration different from the first configuration.

15. The method of claim 13, further comprising:
    forming third solder balls on at least one of the substrate and a third die;
    forming a third group of at least three surface acoustic wave resonators on the third die; and
    positioning the third die on the substrate such that third solder balls are in contact with at least one of bonding pads and electrode bars, at least one of a bonding pad and electrode bar electrically connecting a surface acoustic wave resonator of the second group to a surface acoustic wave resonator of the third group.

16. The method of claim 15, wherein the second group of at least three surface acoustic wave resonators are in a first configuration, and the third group of at least three surface acoustic wave resonators are in a second configuration different from the first configuration.

17. A surface acoustic wave band reject filter, comprising:
    a substrate having formed thereon at least one electrode bar and a plurality of bonding pads;
    a first die having formed thereon a first group of at least three surface acoustic wave resonators, at least two of the at least three surface acoustic wave resonators of the first group being electrically connected by one of the at least one electrode bar, the at least three surface acoustic wave resonators being formed on a side of the first die facing the substrate and collectively exhibiting a band reject filter response, all of the surface acoustic wave resonators formed on the first die being adjacent and geometrically aligned so that main axes oriented along a length of each of the surface acoustic wave resonators formed on the first die are one of parallel and coincident; and
    first solder balls positioned to electrically connect positions on the first die to the at least one electrode bar and bonding pads of the substrate.

18. The surface acoustic wave band reject filter of claim 17, further comprising:
    a second die having formed thereon a second group of at least three surface acoustic wave resonators at least two of which are electrically connected by a second one of the at least one electrode bar; and
    second solder balls positioned to electrically connect positions on the second die to the at least one electrode bar and bonding pads of the substrate, the second solder balls being positioned such that a distance between the second solder balls does not exceed about 2 millimeters.

19. The surface acoustic wave band reject filter of claim 17, wherein the first group of at least three surface acoustic wave resonators are electrically connected in a series-parallel-series configuration.

20. The surface acoustic wave band reject filter of claim 17, wherein the first group of at least three surface acoustic wave resonators are electrically connected in a parallel-series-parallel configuration.

* * * * *